US012727241B2

(12) United States Patent
Lin et al.

(10) Patent No.: US 12,727,241 B2
(45) Date of Patent: Sep. 1, 2026

(54) STACKED MULTI-GATE DEVICE WITH DIFFUSION STOPPING LAYER AND MANUFACTURING METHOD THEREOF

(71) Applicant: TAIWAN SEMICONDUCTOR MANUFACTURING COMPANY, LTD., Hsinchu (TW)

(72) Inventors: Chien-Yu Lin, Yilan County (TW); Tien-Shun Chang, New Taipei City (TW); Yi-Syuan Siao, Changhua City (TW); Su-Hao Liu, Chiayi County (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 18/330,300

(22) Filed: Jun. 6, 2023

(65) Prior Publication Data

US 2024/0413155 A1 Dec. 12, 2024

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC ............... H10D 84/856; H10D 30/014; H10D 30/6735; H10D 62/121; H10D 62/151;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 113130489 A * 7/2021 ....... H10D 84/83135
TW 202205449 A 2/2022
(Continued)

OTHER PUBLICATIONS

English translation of CN-113130489-A (Year: 2021).*

*Primary Examiner* — William B Partridge
*Assistant Examiner* — David Paul Sedorook
(74) *Attorney, Agent, or Firm* — Maschoff Brennan

(57) ABSTRACT

A method includes forming a fin structure including a first channel layer, a sacrificial layer, and a second channel layer over a substrate; forming a dummy gate structure across the fin structure; recessing the fin structure; epitaxially growing first source/drain epitaxial structures on opposite sides of the first channel layer; forming first dielectric layers to cover the first source/drain epitaxial structures, respectively; epitaxially growing second source/drain epitaxial structures on opposite sides of the second channel layer; removing the dummy gate structure and the sacrificial layer to form a gate trench between the first source/drain epitaxial structures and between the second source/drain epitaxial structures; and forming a metal gate structure in the gate trench. The second source/drain epitaxial structures are over the first dielectric layers, respectively.

20 Claims, 37 Drawing Sheets

100g

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 88/00*** | (2026.01) |
| ***H10P 30/40*** | (2026.01) |

(52) U.S. Cl.
CPC ....... *H10D 30/6735* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0188* (2025.01); *H10D 84/038* (2025.01); *H10D 88/01* (2025.01); *H10P 30/40* (2026.01)

(58) Field of Classification Search
CPC ............. H10D 64/017; H10D 84/0167; H10D 84/017; H10D 84/0188; H10D 84/038; H10D 88/01; H10D 84/85; H10D 30/6757; H10D 84/0151; H10D 84/83; H10D 88/00; H01L 21/31155
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 * | 1/2017 | Huang | H10D 62/122 |
| 9,576,814 | B2 | 2/2017 | Wu et al. | |
| 9,608,116 | B2 | 3/2017 | Ching et al. | |
| 10,128,115 | B2 * | 11/2018 | Nieh | H01L 21/26593 |
| 10,734,224 | B2 | 8/2020 | Smith et al. | |
| 2004/0129988 | A1 * | 7/2004 | Rotondaro | H01L 21/28035 257/407 |
| 2020/0006560 | A1 * | 1/2020 | Singh | H10D 30/797 |
| 2020/0105751 | A1 * | 4/2020 | Dewey | H10D 62/235 |
| 2023/0142226 | A1 * | 5/2023 | Xie | H10D 30/6757 257/288 |

FOREIGN PATENT DOCUMENTS

| | | | |
|---|---|---|---|
| TW | 202236434 | A | 9/2022 |
| TW | 202245235 | A | 11/2022 |
| TW | 202310155 | A | 3/2023 |

* cited by examiner

100a

100a 150
150
140
148
146
144
142
R1
125
124b
122b
124b
122b
124m
215
215
122a
124a
122a
124a
122a
112
170
160
170
110
S/D
CH
S/D

100c

100e

100f

100g

STACKED MULTI-GATE DEVICE WITH DIFFUSION STOPPING LAYER AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired. As the semiconductor industry further progresses in pursuit of higher device density, challenges from both fabrication and design issues have led to stacked device structure configurations, such as complementary field effect transistors (C-FET).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
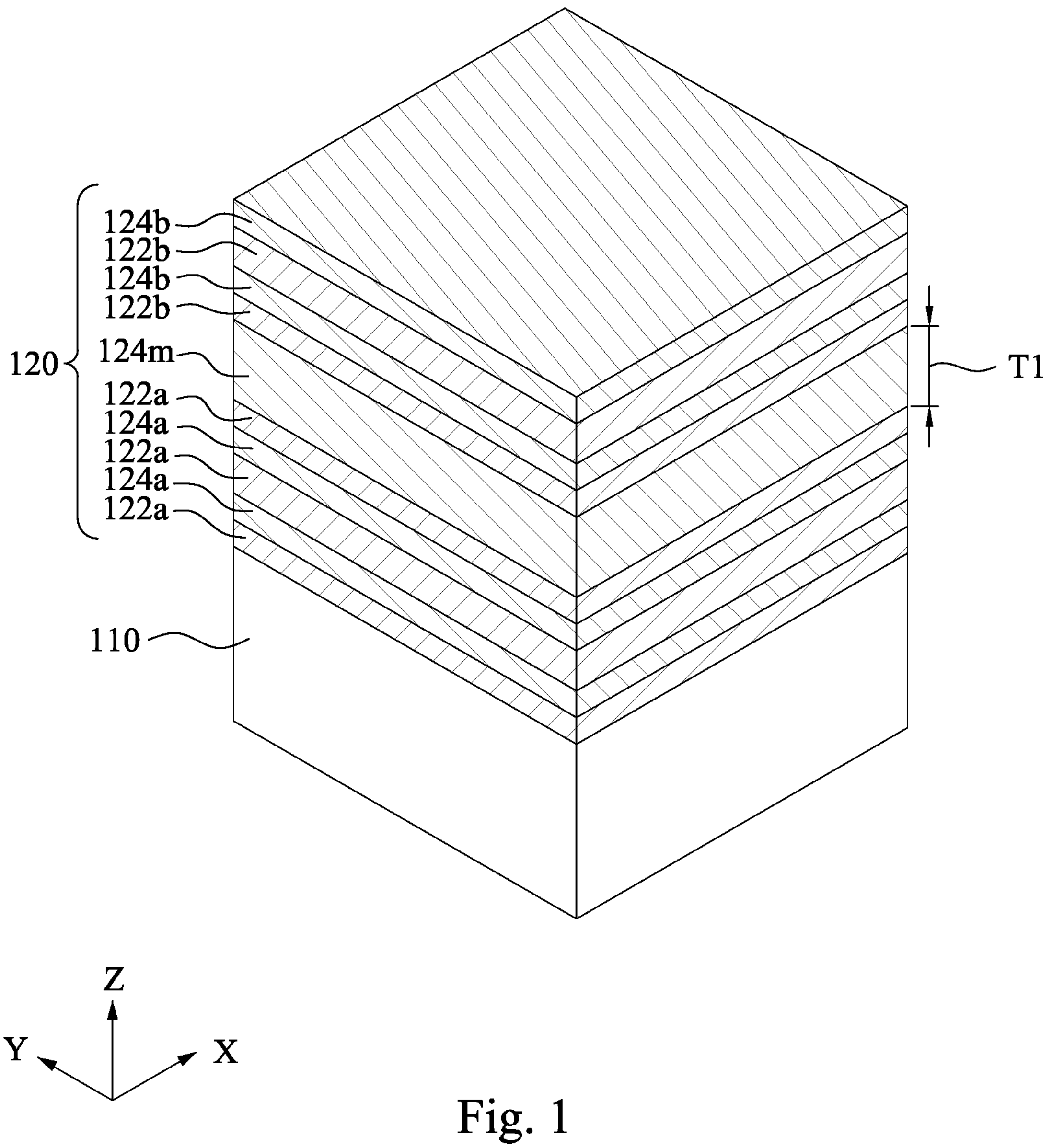
FIGS. 1-14 illustrate perspective views and cross-sectional views of intermediate stages in the formation of an integrated circuit structure (or a semiconductor device) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around”, “about”, “approximately”, or “substantially” shall generally mean within 20 percent, or within 10 percent, or within 5 percent of a given value or range. Numerical quantities given herein are approximate, meaning that the term “around”, “about”, “approximately”, or “substantially” can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term “etch selectivity” refers to the ratio of the etch rates of two different materials under the same etching conditions. As used herein, the term “high-k” refers to a high dielectric constant. In the field of semiconductor device structures and manufacturing processes, high-k refers to a dielectric constant that is greater than the dielectric constant of $SiO_2$ (e.g., greater than 3.9). As used herein, the term “low-k” refers to a low dielectric constant. In the field of semiconductor device structures and manufacturing processes, low-k refers to a dielectric constant that is less than the dielectric constant of $SiO_2$ (e.g., less than 3.9). As used herein, the term “p-type” defines a structure, layer, and/or region as being doped with p-type dopants, such as boron. As used herein, the term “n-type” defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The nanostructure transistor (e.g. gate all around (GAA) transistor) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to stacked multi-gate devices, e.g., complementary FET (CFET) devices, including a diffusion stopping layer between source/drain epitaxial structures of the CFET. The diffusion stopping layer is configured to improve the current leakage problem and/or dopant diffusion between the source/drain epitaxial structures.

Figure 12A:
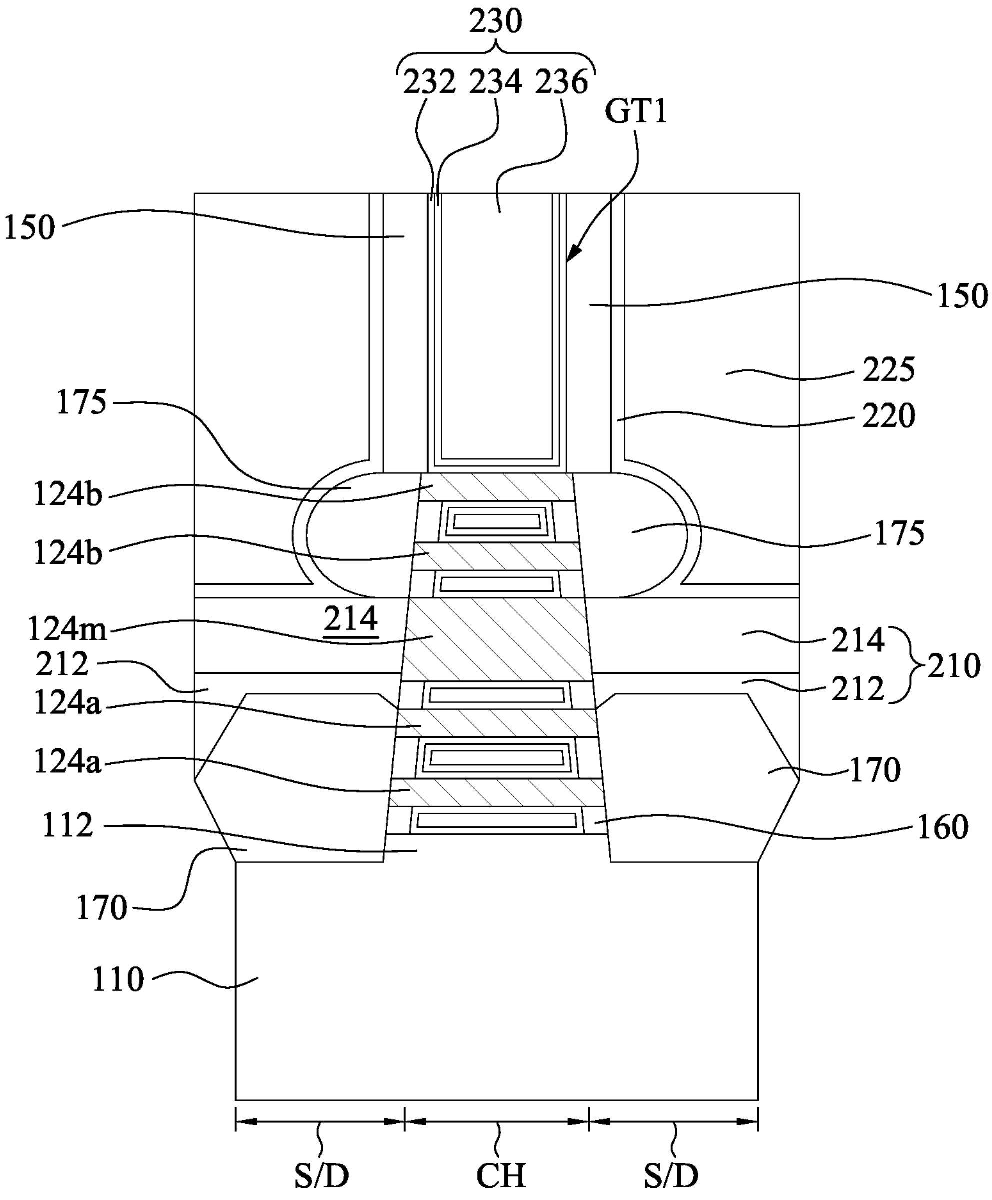
Figure 12B:
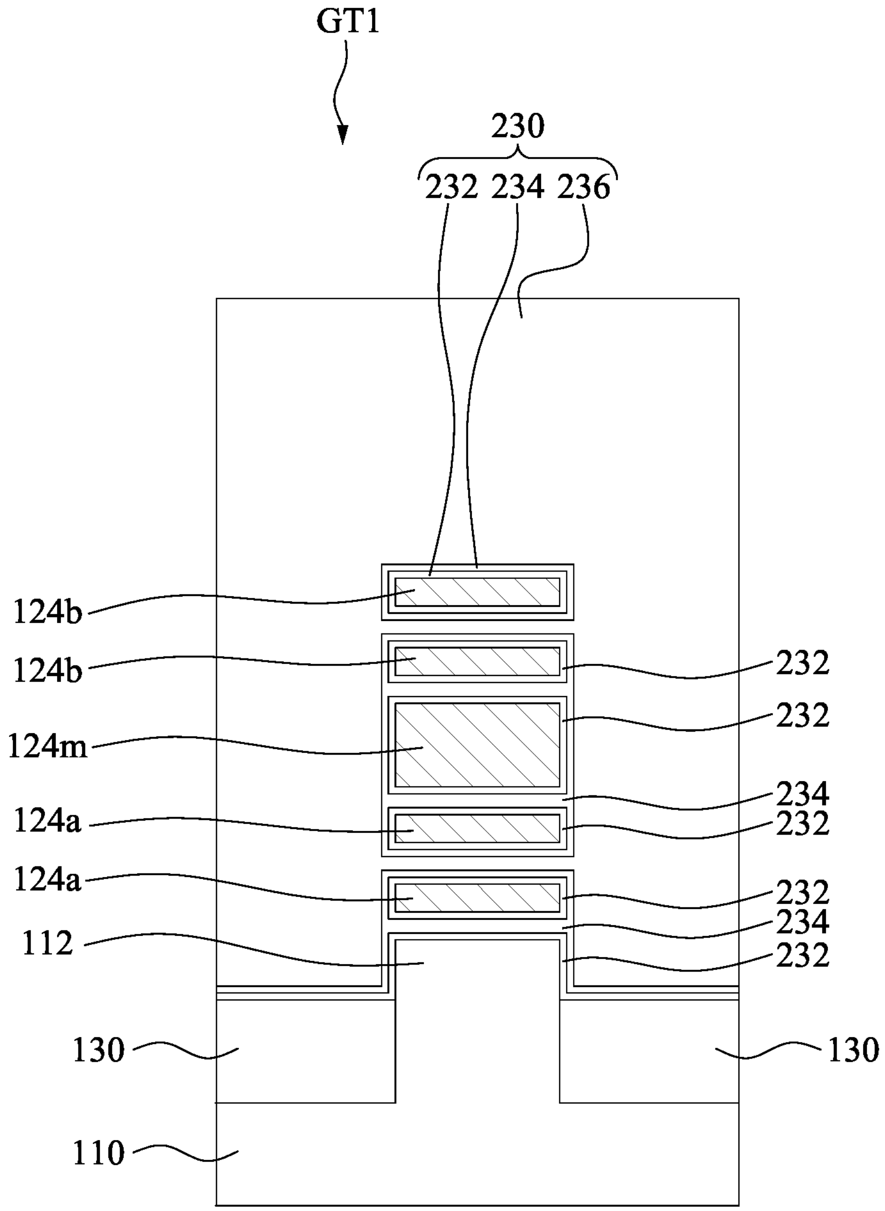
Figure 13:
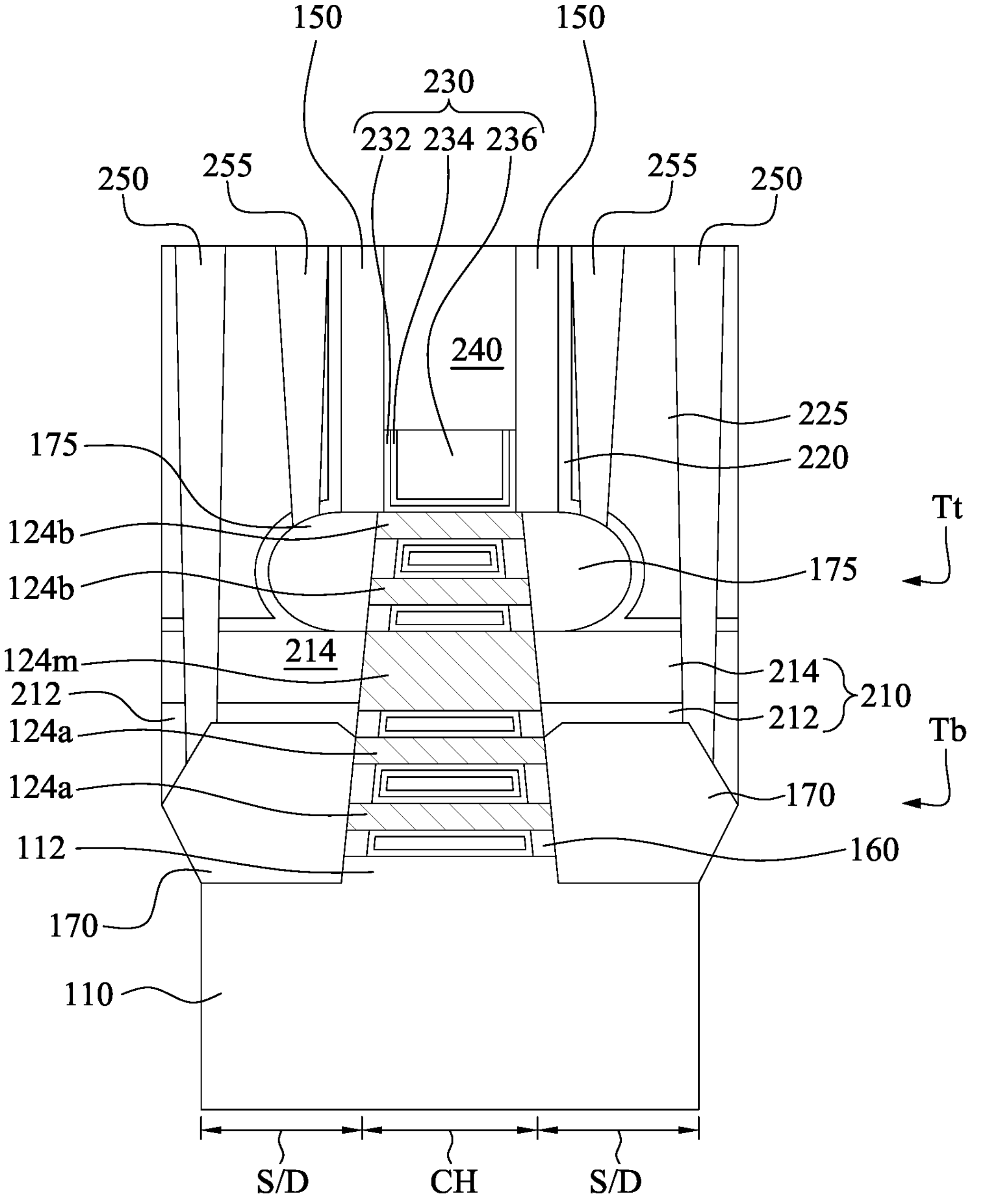
Figure 14:
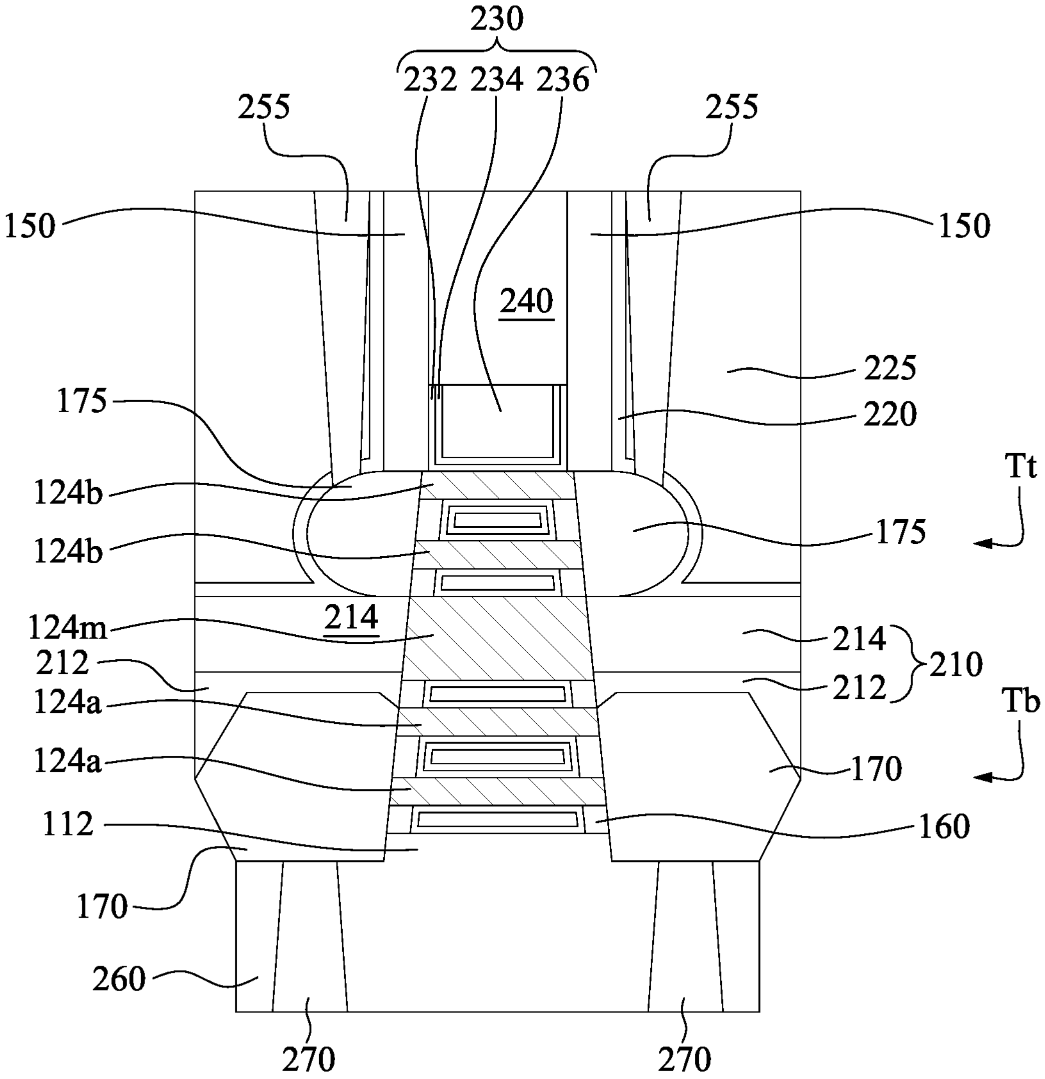

FIGS. 1-14 illustrate perspective views and cross-sectional views of intermediate stages in the formation of an integrated circuit structure (or a semiconductor device) 100*a* in accordance with some embodiments of the present disclosure. In some embodiments, the integrated circuit structures 100*a* in FIGS. 13 and 14 are CFET devices. In addition to the integrated circuit structure, FIGS. 1-3A depict X-axis, Y-axis, and Z-axis directions. FIGS. 3B, 4-9A, 10, 11A, 12A, 13, and 14 are cross-sectional views of some embodiments of the integrated circuit structure 100*a* at intermediate stages along a first cut (e.g., cut I-I in FIG. 3A). FIGS. 3C, 11B, and 12B are cross-sectional views of some embodiments of the integrated circuit structure 100*a* at intermediate stages along a second cut (e.g., cut II-II in FIG. 3A). The formed devices include a p-type transistor (such as a p-type GAA FET) and an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 1-14, and some of the operations described below can be replaced or eliminated, for additional embodiments of the method. The order of the operations/processes may be interchangeable.

Referring to FIG. 1, an epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122*a*, 122*b* of a first composition interposed by epitaxial layers 124*a*, 124*b*, 124*m* of a second composition. The first and second compositions can be different. In some embodiments, the epitaxial layers 122*a*, 122*b* are SiGe and the epitaxial layers 124*a*, 124*b*, 124*m* are silicon (Si). However, other embodiments are possible including those that provide for a first composition and a second composition having different etch selectivity.

The epitaxial layers 124*a* and 124*b* or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124*a* and 124*b* to define a channel or channels of a device is further discussed below.

In FIG. 1, the epitaxial layers 124*b* are disposed above the epitaxial layers 124*a*. It is noted that two layers of the epitaxial layers 124*a* and two layers of the epitaxial layers 124*b* are arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of each of the epitaxial layers 124*a* and 124*b* is between 1 and 10.

The epitaxial layers 122*a* are interposed by the epitaxial layers 124*a*, the epitaxial layers 122*b* are interposed by the epitaxial layers 124*b*, and the epitaxial layer 124*m* is between the topmost epitaxial layer 122*a* and the bottommost epitaxial layer 122*b*. In some embodiments, the epitaxial layers 122*a* and 122*b* have same or different thicknesses, and the epitaxial layer 124*m* has a thickness T1 greater than the thicknesses of the epitaxial layers 122*a*, 122*b*, 124*a*, and 124*b*. In some embodiments, the thickness T1 is determined by the thickness of the doped isolation structure 210 (see FIG. 9A). In some embodiments, the epitaxial layers 122*a* and 122*b* each has a thickness in a range from about 2 nm to about 30 nm.

As described in more detail below, the epitaxial layers 124*a* and 124*b* may serve as channel region(s) for a subsequently-formed semiconductor device and the thickness is chosen based on device performance considerations. The epitaxial layers 122*a* and 122*b* in channel regions(s) may eventually be removed and serve to define a vertical distance between adjacent channel region(s) for a subsequently-formed multi-gate device and the thickness is chosen based on device performance considerations. Accordingly, the epitaxial layers 122*a* and 122*b* may also be referred to as sacrificial layers, and epitaxial layers 124*a* and 124*b* may also be referred to as (bottom/top) channel layers.

By way of example, epitaxial growth of the layers of the epitaxial stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124*a*, 124*b*, and 124*m* include the same material as the substrate 110. In some embodiments, the epitaxial layers 122*a*, 122*b* and 124*a*, 124*b*, 124*m* include a different material than the substrate 110. As stated above, in at least some examples, the epitaxial layers 122*a* and 122*b* include an epitaxially grown silicon germanium (SiGe) layer, where the germanium concentration in the epitaxial layers 122*a* and 122*b* is greater than 0 and equal to or less than about 80%, and the epitaxial layers 124*a*, 124*b*, and 124*m* include an epitaxially grown silicon (Si) layer. Alternatively, in some embodiments, either of the epitaxial layers 122*a*, 122*b* and 124*a*, 124*b*, 124*m* may include other materials such as germanium, tin, a compound semiconductor such as silicon carbide, gallium arsenide, gallium phosphide, indium phosphide, indium arsenide, and/or indium antimonide, an alloy semiconductor such as SiGe, GeSn, GaAsP. AlInAs, AlGaAs, InGaAs, GaInP, and/or GaInAsP, III-V, or combinations thereof. As discussed, the materials of the epitaxial layers 122*a*, 122*b* and 124*a*, 124*b*, 124*m* may be chosen based on providing differing oxidation and/or etching selectivity properties.

Figure 2:
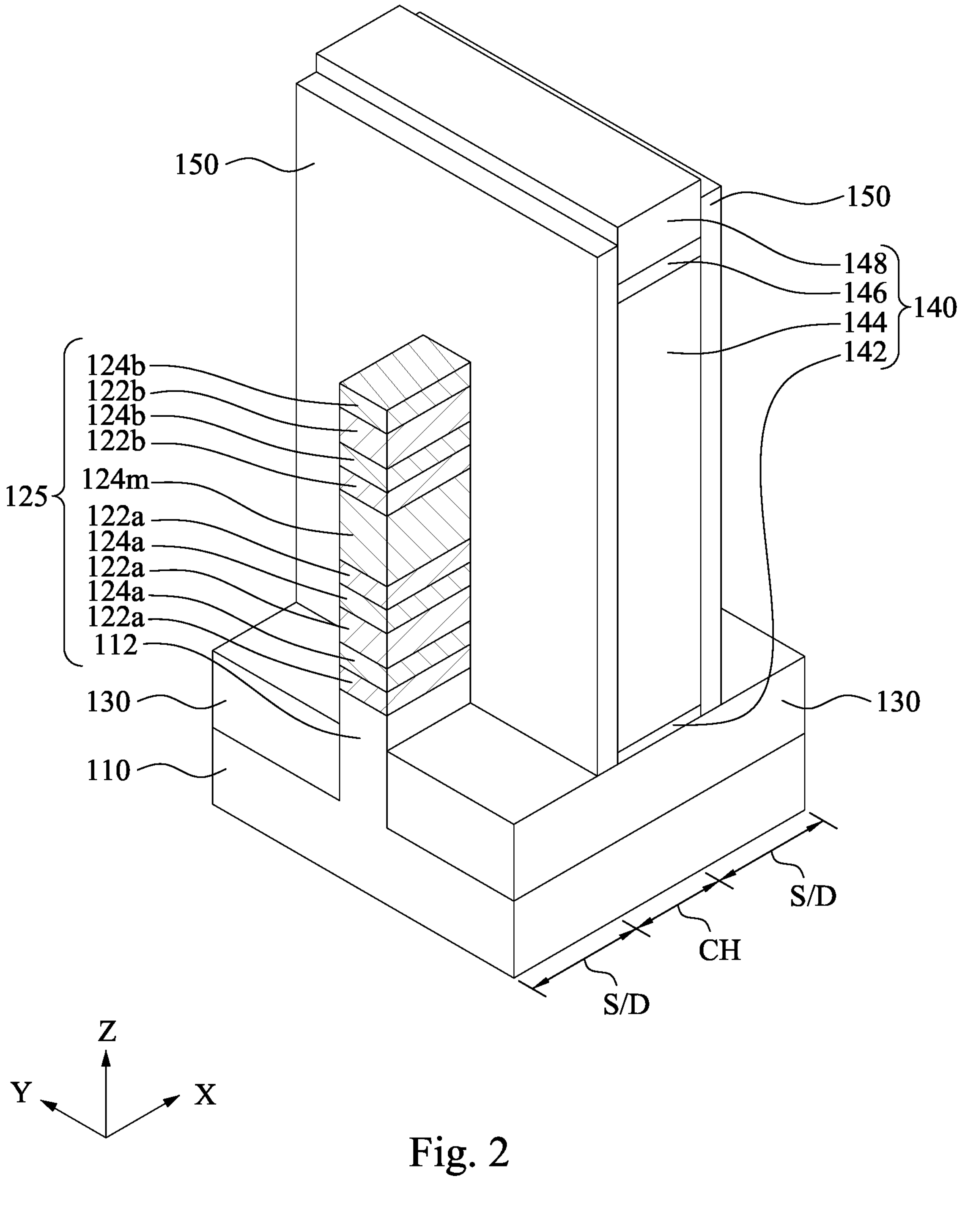

Reference is made to FIG. 2. At least one fin structure 125 extending from the substrate 110 is formed. In various embodiments, the fin structure 125 includes a protruding portion 112 formed from the substrate 110 and portions of each of the epitaxial layers of the epitaxial stack 120 including epitaxial layers 122*a*, 122*b* and 124*a*, 124*b*, 124*m*. The fin structure 125 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structure 125 by etching the epitaxial stack 120. The etching process may include dry etching, wet etching, reactive ion etching (RIE), and/or other suitable processes.

For example, a hard mask (HM) layer is formed over the epitaxial stack 120 prior to forming the fin structure 125. The fin structure 125 may subsequently be fabricated using suitable processes including photolithography and etch processes. The photolithography process may include forming a photoresist layer (not shown) over the HM layer, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 110, and layers formed thereupon, while an etch process forms trenches in unprotected regions through the HM layer, through the epitaxial stack 120, and into the substrate 110, thereby leaving the fin structure 125. The trenches may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fin structure 125.

Next, isolation structures 130 are formed to surround the fin structure 125. The isolation structures 130 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structures 130 may also include a dielectric material over the liner oxide, and the dielectric material may be formed using flowable chemical vapor deposition (FCVD), spin-on coating, or the like.

The isolation structures 130 are then planarized, such that the HM layer is removed, and the top surface of the fin structure 125 is exposed. Subsequently, the isolation structures 130 are recessed, so that the top portion of the fin structure 125 protrudes higher than the top surfaces of the neighboring isolation structures 130. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation structures 130 is performed using a wet etch process. The etching chemical may include diluted HF, for example.

At least one dummy gate structure 140 is formed over the substrate 110 and is partially disposed over the fin structure 125. The portion of the fin structure 125 underlying the dummy gate structure 140 may be referred to as the channel region CH. The dummy gate structure 140 may also define source/drain regions S/D of the fin structure 125, for example, the regions of the fin structure 125 adjacent and on opposing sides of the channel region CH.

Dummy gate formation operation forms a gate dielectric layer, a dummy gate electrode layer, and a hard mask which may include multiple layers (e.g., an oxide layer and a nitride layer) over the dummy gate electrode layer. The hard mask is then patterned, followed by patterning the dummy gate electrode layer and the gate dielectric layer by using the patterned hard mask as an etch mask. The etch process may include a wet etch, a dry etch, and/or combinations thereof. As such, a dummy gate structure 140 including a gate dielectric layer 142, a dummy gate electrode layer 144, and a hard mask (e.g., a nitride layer 146 and an oxide layer 148) is formed.

After formation of the dummy gate structure 140 is completed, gate spacers 150 are formed on sidewalls of the dummy gate structure 140. For example, a spacer material layer is deposited on the substrate 110. The spacer material layer may be a conformal layer that is subsequently etched back to form gate sidewall spacers. In the illustrated embodiment, a spacer material layer is disposed conformally on top and sidewalls of the dummy gate structure 140. The spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers, such as a first spacer layer and a second spacer layer formed over the first spacer layer. By way of example, the spacer material layer may be formed by depositing a dielectric material over the dummy gate structure 140 using suitable deposition processes. An anisotropic etching process is then performed on the deposited spacer material layer to expose portions of the fin structure 125 not covered by the dummy gate structure 140 (e.g., over the source/drain regions S/D of the fin structure 125). Portions of the spacer material layer directly above the dummy gate structure 140 may be completely removed by this anisotropic etching process. Portions of the spacer material layer on sidewalls of the dummy gate structure 140 may remain, forming gate sidewall spacers, which are denoted as the gate spacers 150, for the sake of simplicity.

Figure 3A:
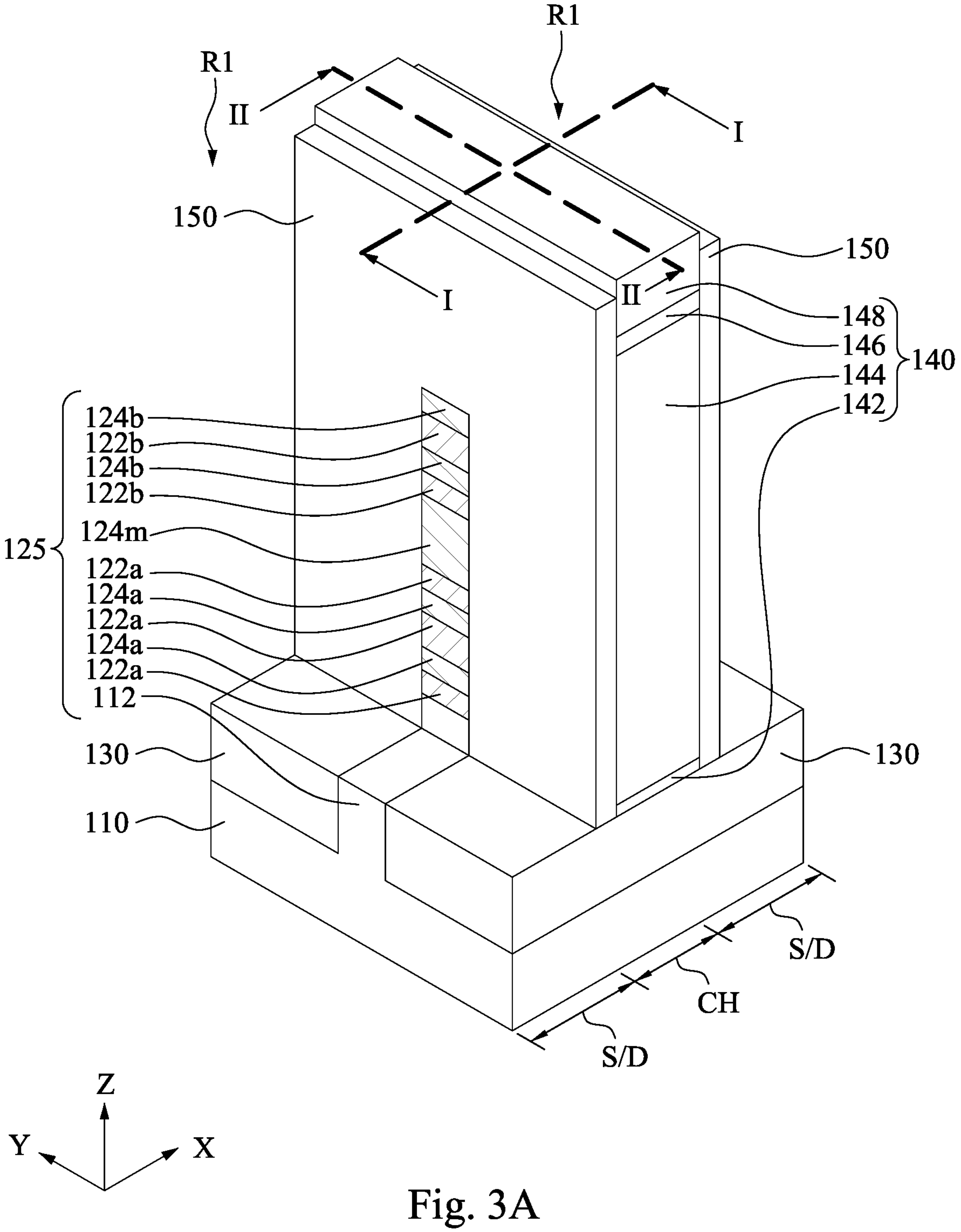
Figure 3B:
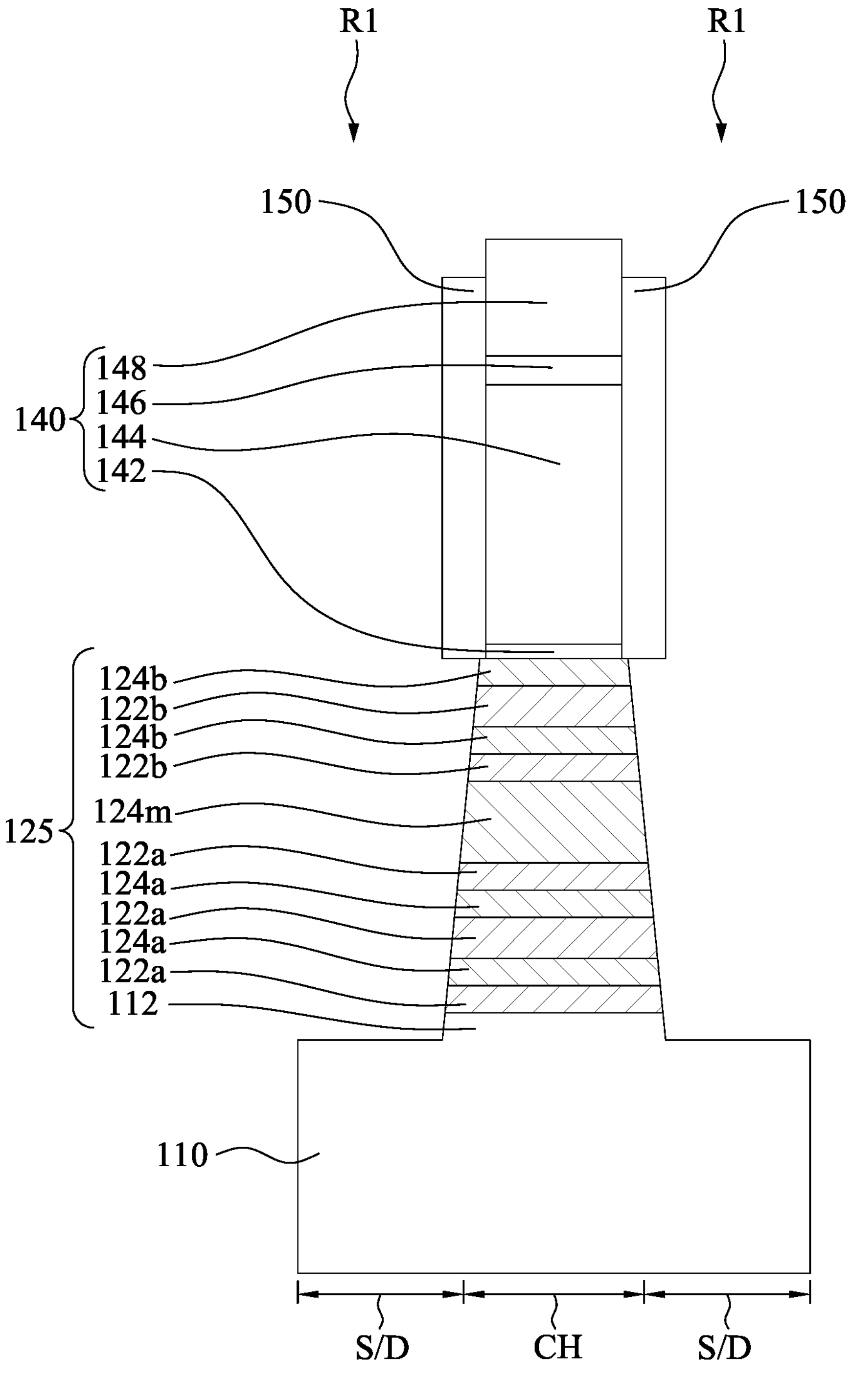
Figure 3C:
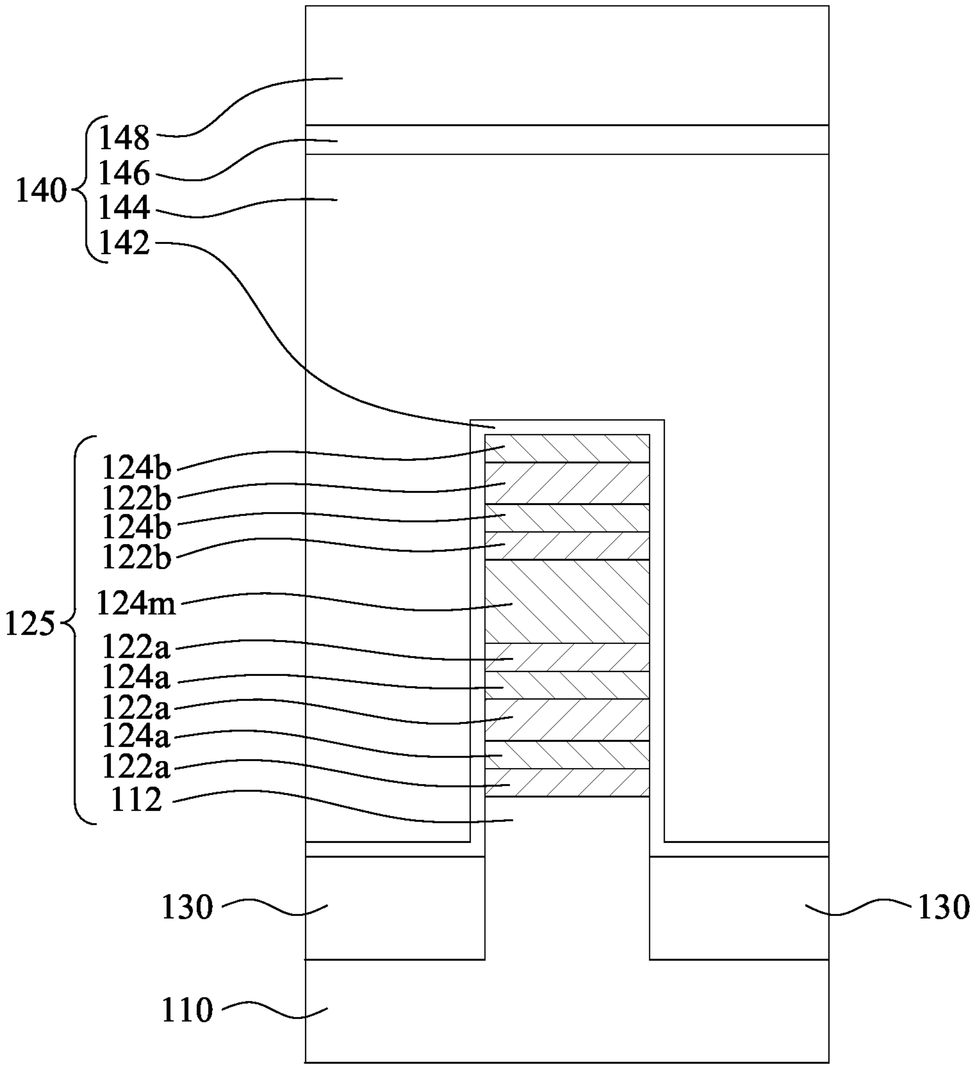

Reference is made to FIGS. 3A-3C, where FIG. 3B is a cross-sectional view taken along line I-I in FIG. 3A, and FIG. 3C is a cross-sectional view taken along line II-II in FIG. 3A. Exposed portions of the fin structure 125 that extend laterally beyond the gate spacers 150 (e.g., in source/drain regions S/D of the fin structure 125) are etched by using, for example, an anisotropic etching process that uses the dummy gate structure 140 and the gate spacers 150 as an etch mask, resulting in recesses R1 into the fin structure 125. After the anisotropic etching, end surfaces of the epitaxial layers 122*a*, 122*b* and the epitaxial layers 124*a*, 124*b*, 122*m* are substantially coterminous, due to the anisotropic etching. In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, since the recesses R1 have high aspect ratios, the top epitaxial layers of the fin structure 125 may be over-etched. Therefore, as shown in FIG. 3B, the lengths of the top epitaxial layers (e.g., the epitaxial layers 122*b* and 124*b*) are shorter than the lengths of the bottom epitaxial layers (e.g., the epitaxial layers 122*a* and 124*a*).

Figure 4:
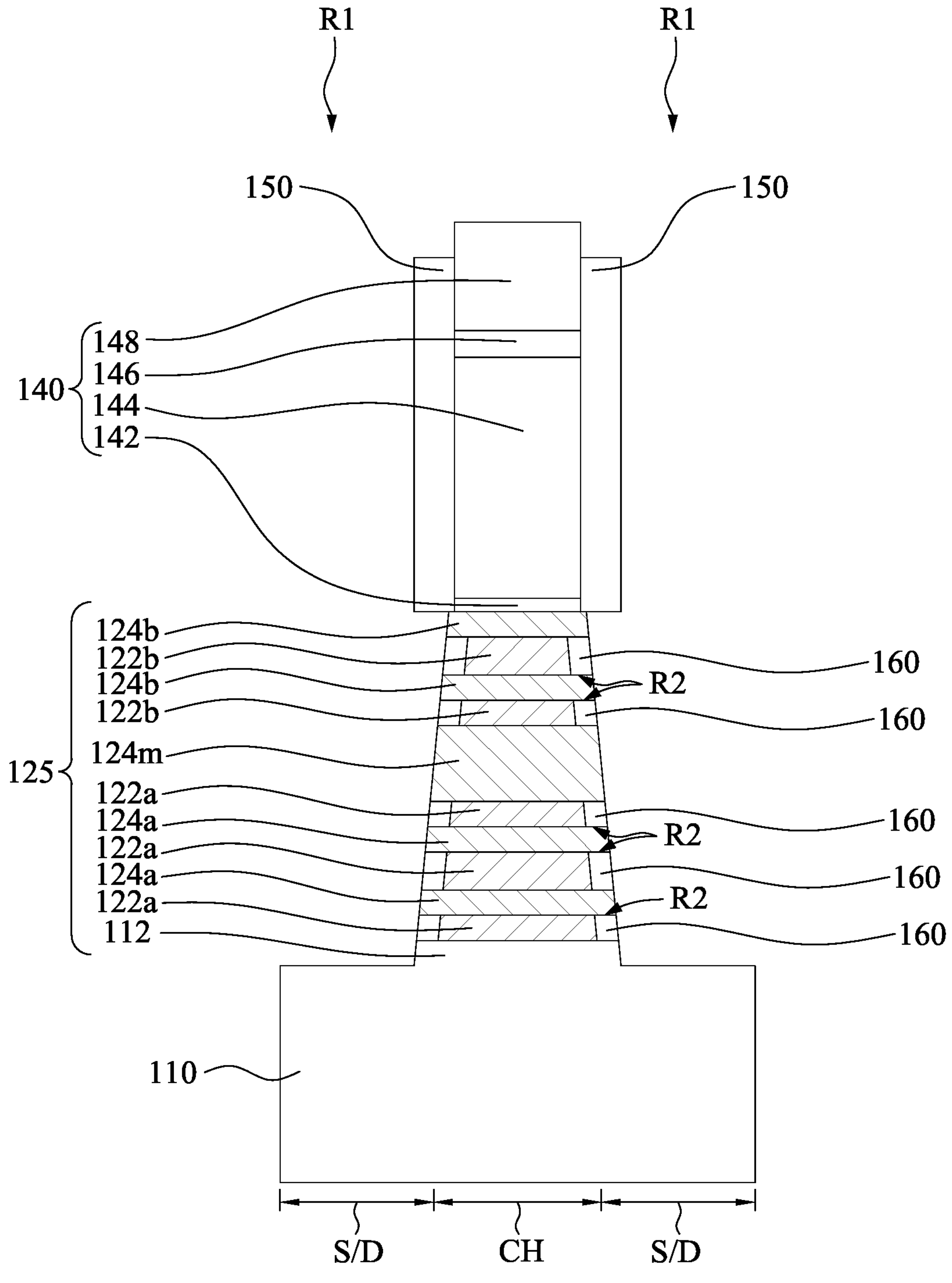

Reference is made to FIG. 4. The epitaxial layers 122*a* and 122*b* are laterally or horizontally recessed by using suitable etch techniques, resulting in lateral recesses R2 each vertically between corresponding epitaxial layers 124*a*, 124*b*, and 124*m*. This operation may be performed by using a selective etching process. By way of example and not limitation, the epitaxial layers 122*a* and 122*b* are SiGe and the epitaxial layers 124*a*, 124*b*, and 124*m* are silicon allowing for the selective etching of the epitaxial layers 122*a* and 122*b*. In some embodiments, the selective dry etching etches SiGe at a faster etch rate than it etches Si. As a result, the epitaxial layers 124*a*, 124*b*, and 124*m* laterally extend past opposite end surfaces of the epitaxial layers 122*a* and 122*b*.

Subsequently, inner dielectric spacers 160 are filled in the recesses R2, respectively. For example, spacer material layers are formed to fill the recesses R2 left by the lateral etching of the epitaxial layers 122*a* and 122*b*. The spacer material layer may be a low-k dielectric material, such as $SiO_2$, SiN, SiC, SiON, SiCN, or SiOCN, and may be formed by a suitable deposition method, such as ALD. In some embodiments, the spacer material layer is intrinsic or un-doped with impurities. The spacer material layer can be formed using CVD, including LPCVD and PECVD, PVD, ALD, or other suitable processes.

After the deposition of the spacer material layer, an anisotropic etching process may be performed to trim the deposited spacer material layer, such that portions of the deposited spacer material layer that fill the recesses R2 left by the lateral etching of the epitaxial layers 122*a* and 122*b* are left. After the trimming process, the remaining portions of the deposited spacer material are denoted as inner dielectric spacers 160 in the recesses R2, for the sake of simplicity. The inner dielectric spacers 160 serve to isolate metal gates from source/drain epitaxial structures formed in subsequent processing.

Figure 5:
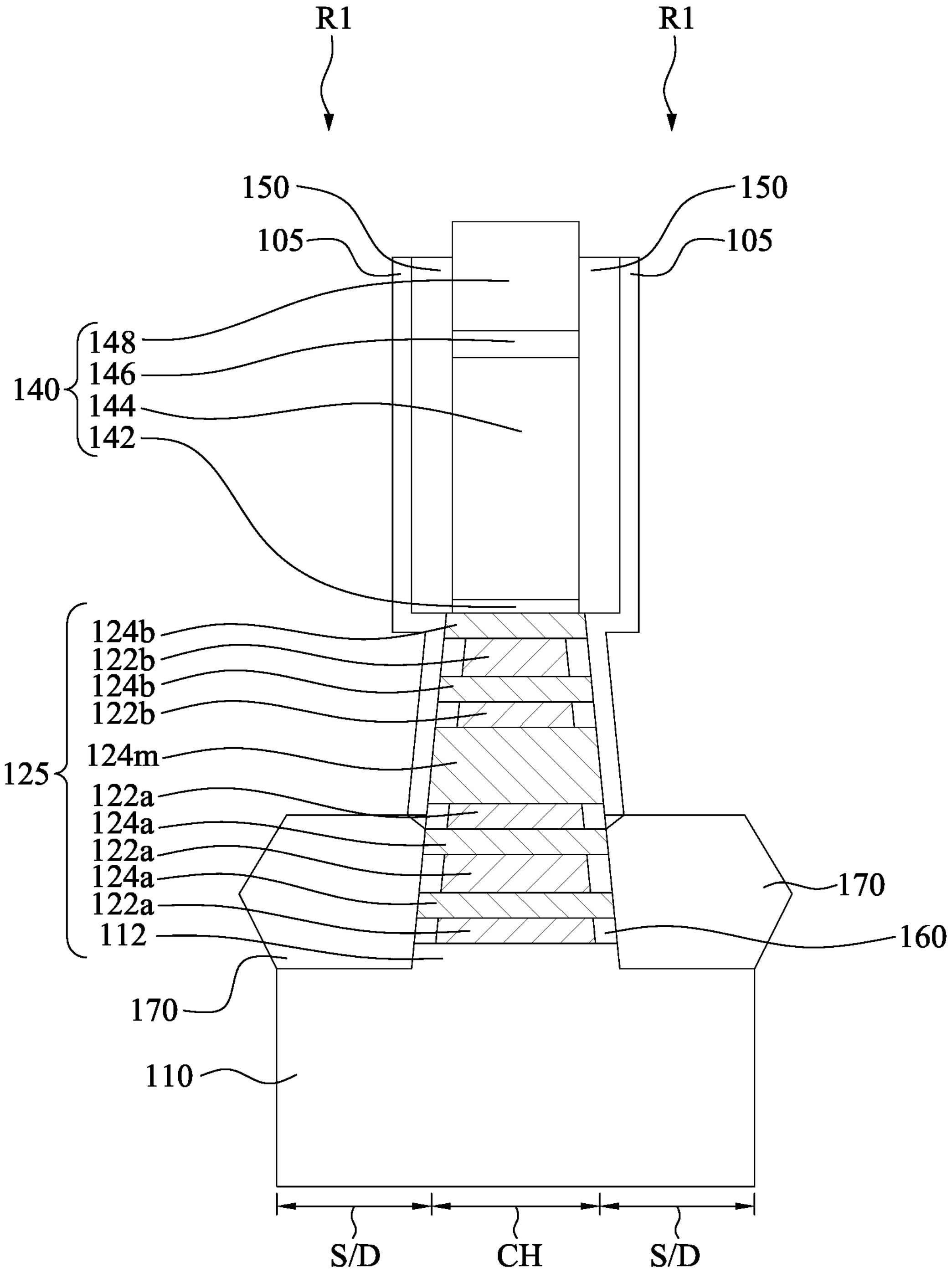

Reference is made to FIG. 5. Protection layers 105 are formed to cover the sidewalls of the epitaxial layers 124*b* and 124*m* but expose the sidewalls of the epitaxial layers 124*a*. For example, a dummy material is deposited in the recesses R1 and then etched back to a height lower than the epitaxial layer 124*m*. Subsequently, a dielectric layer is conformal formed in the recesses R1 and the dummy material. Horizontal portions of the dielectric layer are then removed while vertical portions of the dielectric layer (i.e., the protection layers 105) remain in the recesses R1. The dummy material is then removed to expose the sidewalls of the epitaxial layers 124*a* and the substrate 110. It is noted that the formation of the protection layers 105 presented above is merely an example, and not intended to limit the present disclosure beyond what is explicitly recited in the claims. In some embodiments, the protection layer 105 is made of silicon oxygen carbon nitride (SiOCN), or other suitable materials.

First source/drain epitaxial structures 170 are formed over the source/drain regions S/D of the fin structure 125. The first source/drain epitaxial structures 170 are connected to the epitaxial layers 124*a*. The first source/drain epitaxial structures 170 may be formed by performing an epitaxial growth process that provides an epitaxial material on the fin structure 125. During the epitaxial growth process, the protection layers 105 and the inner dielectric spacers 160 limit the first source/drain epitaxial structures 170 to the source/drain regions S/D. In some embodiments, the lattice constants of the first source/drain epitaxial structures 170 are different from the lattice constant of the epitaxial layers 124*a*, so that the epitaxial layers 124*a* can be strained or stressed by the first source/drain epitaxial structures 170 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124*a* and 124*b*.

In some embodiments, the first source/drain epitaxial structures 170 may include Ge, Si, GaAs, AlGaAs, SiGe, GaAsP. SiP, or other suitable material. The first source/drain epitaxial structures 170 may be in-situ doped during the epitaxial process by introducing doping species including: p-type dopants, such as boron or $BF_2$; n-type dopants, such as phosphorus or arsenic; and/or other suitable dopants including combinations thereof. If the first source/drain epitaxial structures 170 are not in-situ doped, an implantation process (i.e., a junction implant process) is performed to dope the first source/drain epitaxial structures 170. In some exemplary embodiments, the first source/drain epitaxial structures 170 in a p-type include SiB, SiGe, SiGe:B, or SiGe:Ga.

Figure 6:
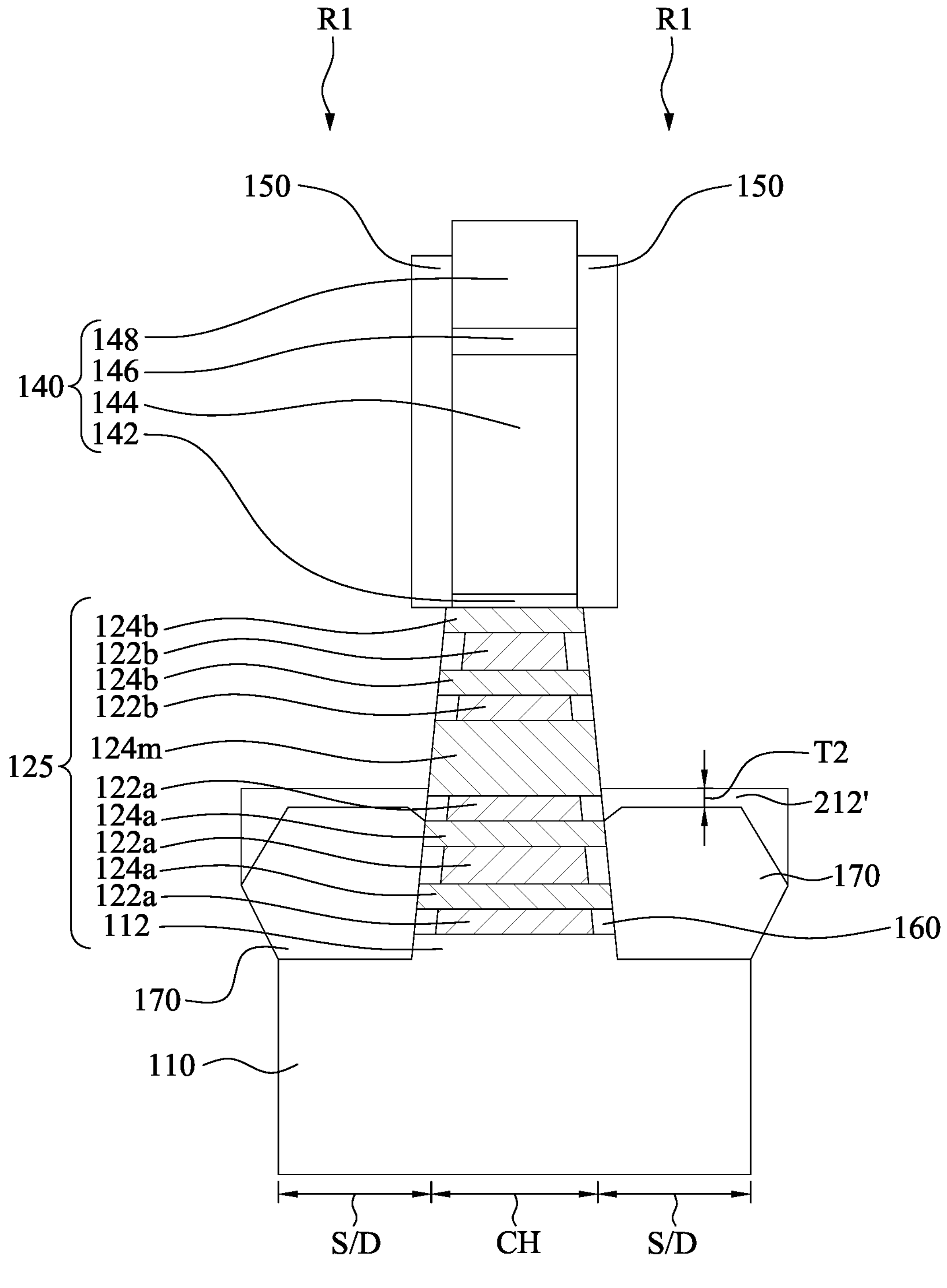

Reference is made to FIG. 6. The protection layers 105 in FIG. 5 are removed. Subsequently, first dielectric layers 212' are formed in the recesses R1 and cover the first source/drain epitaxial structures 170, respectively. For example, dielectric materials are formed in the recesses R1 and an etching back process is performed to form the first dielectric layers 212'. In some embodiments, the dielectric materials are made of amorphous carbon, $SiO_2$, SiN, SiON, SiCN, SiOCN, $Al_2O_3$, $HfO_2$, SiC, combinations thereof, or the like. As such, the dielectric materials have high electrical resistance. The dielectric materials may be formed by ALD, CVD, or other suitable processes. In some embodiments, the first dielectric layers 212' (especially the portion of the first dielectric layers 212' over the topmost portion of the first source/drain epitaxial structures 170) have a thickness T2 in a range from about 2 nm to about 80 nm.

Figure 7:
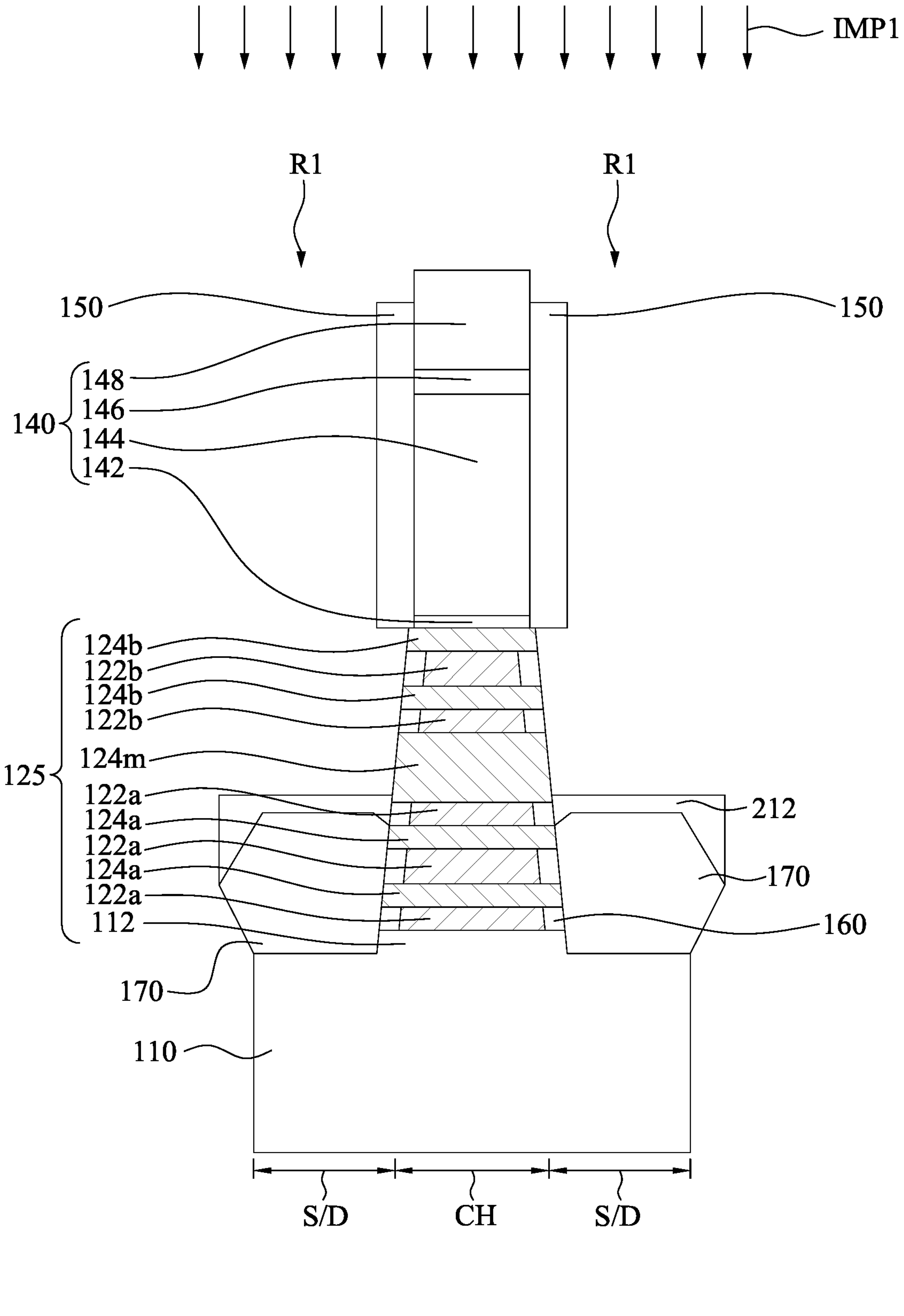

Reference is made to FIGS. 6 and 7. An ion implantation process IMP1 is performed to dope one or more impurities (e.g., dopant ions) into the first dielectric layers 212'. For example, diffusion-blocking dopants (e.g., carbon, fluorine, xenon, silicon, nitrogen, oxygen, sulfur, other suitable species that is able to prevent the dopants in the first source/drain epitaxial structures 170 from diffusing, or combinations thereof) can be implanted into the first dielectric layers 212', thus forming first doped dielectric layers 212.

In some embodiments, the ion implantation process IMP1 is performed at a dose of about 1E14 ion/cm$^2$ to about 1E16 ion/cm$^2$, at an energy of about 1 keV to about 50 keV, at a temperature from about −100° C. to about 500° C., and with a tilt angle from about 0 degree to about 60 degrees. Dopant concentration and/or dopant depth of the resultant first doped dielectric layers 212 depend on the process conditions of the ion implantation process IMP1. If the process conditions of the ion implantation process IMP1 are out of the above selected ranges, the dopant concentration and/or dopant depth in the resultant first doped dielectric layers 212 may be unsatisfactory for preventing the dopants in the first source/drain epitaxial structures 170 from diffusing.

In some embodiments, the ion implantation process IMP1 implants carbon atoms into the first dielectric layers 212', resulting in carbon-doped dielectric layers (i.e., the first doped dielectric layers 212). By way of example and not limitation, the first doped dielectric layers 212 have a dopant concentration in a range from about 1E19 atoms/cm$^3$ to about 1E22 atoms/cm$^3$. If the first doped dielectric layers 212 have an excessively high dopant concentration, the first doped dielectric layers 212 may be sincerely damaged by the ion implantation process IMP1. If the first doped dielectric layers 212 have an excessively low dopant concentration, the diffusion-blocking dopants may not prevent the N-type dopants or P-type dopants in the first source/drain epitaxial structures 170 from diffusing efficiently.

Figure 8:
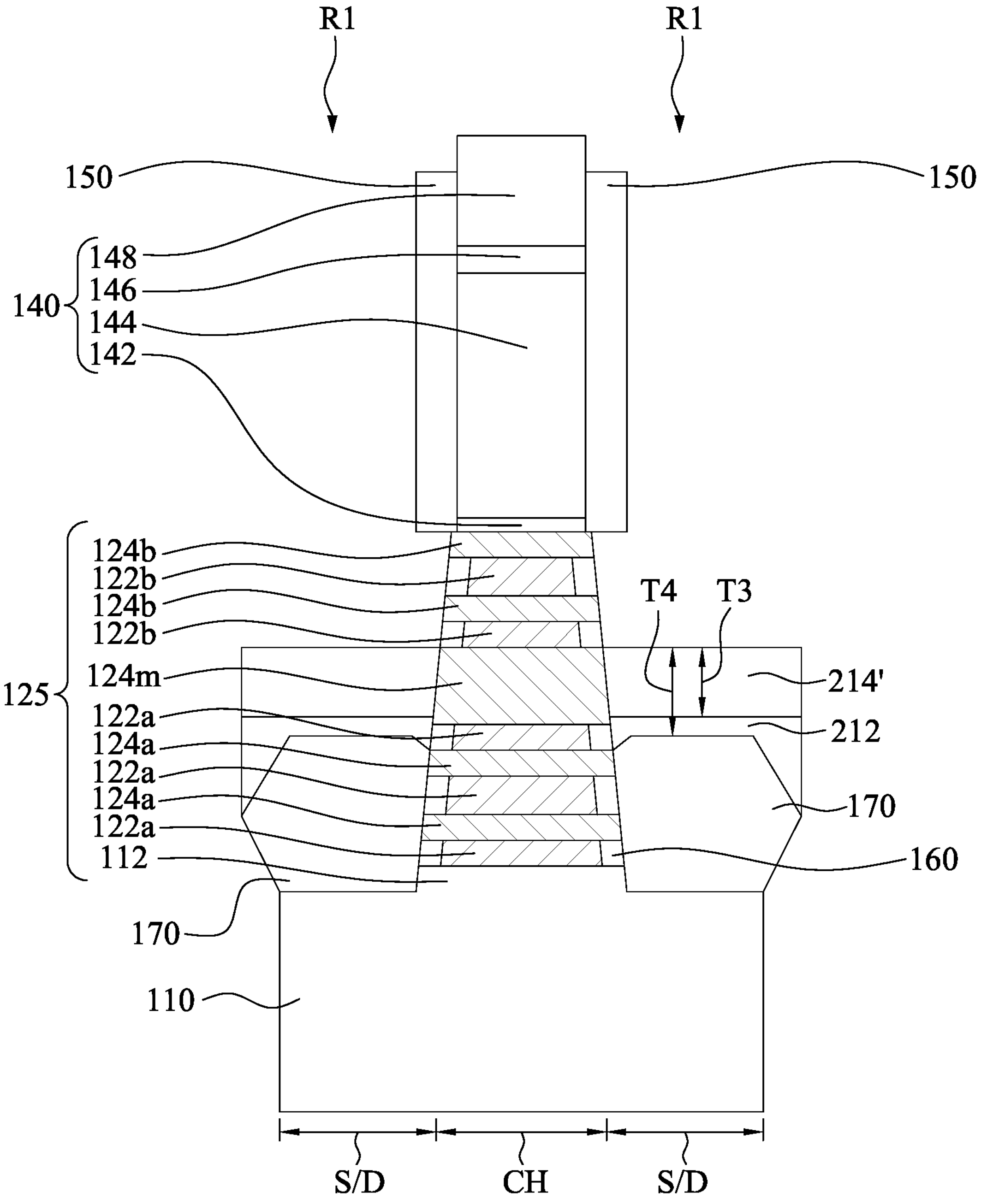

Reference is made to FIG. 8. Second dielectric layers 214' are formed in the recesses R1 and cover the first doped dielectric layers 212, respectively. For example, dielectric materials are formed in the recesses R1 and an etching back process is performed to form the second dielectric layers 214'. In some embodiments, the dielectric materials are made of amorphous carbon, $SiO_2$, SiN, SiON, SiCN, SiOCN, $Al_2O_3$, $HfO_2$, SiC, combinations thereof, or the like. The dielectric materials may be formed by ALD, CVD, or other suitable processes. In some embodiments, the second dielectric layers 214' have a thickness T3 greater than the thickness T2 of the first dielectric layers 212. For example, the thickness T3 is in a range from about 5 nm to about 150 nm. Further, a thickness T4 of the sum of the thicknesses T2 and T3 is in a range from about 5 nm to about 250 nm.

Figure 9A:
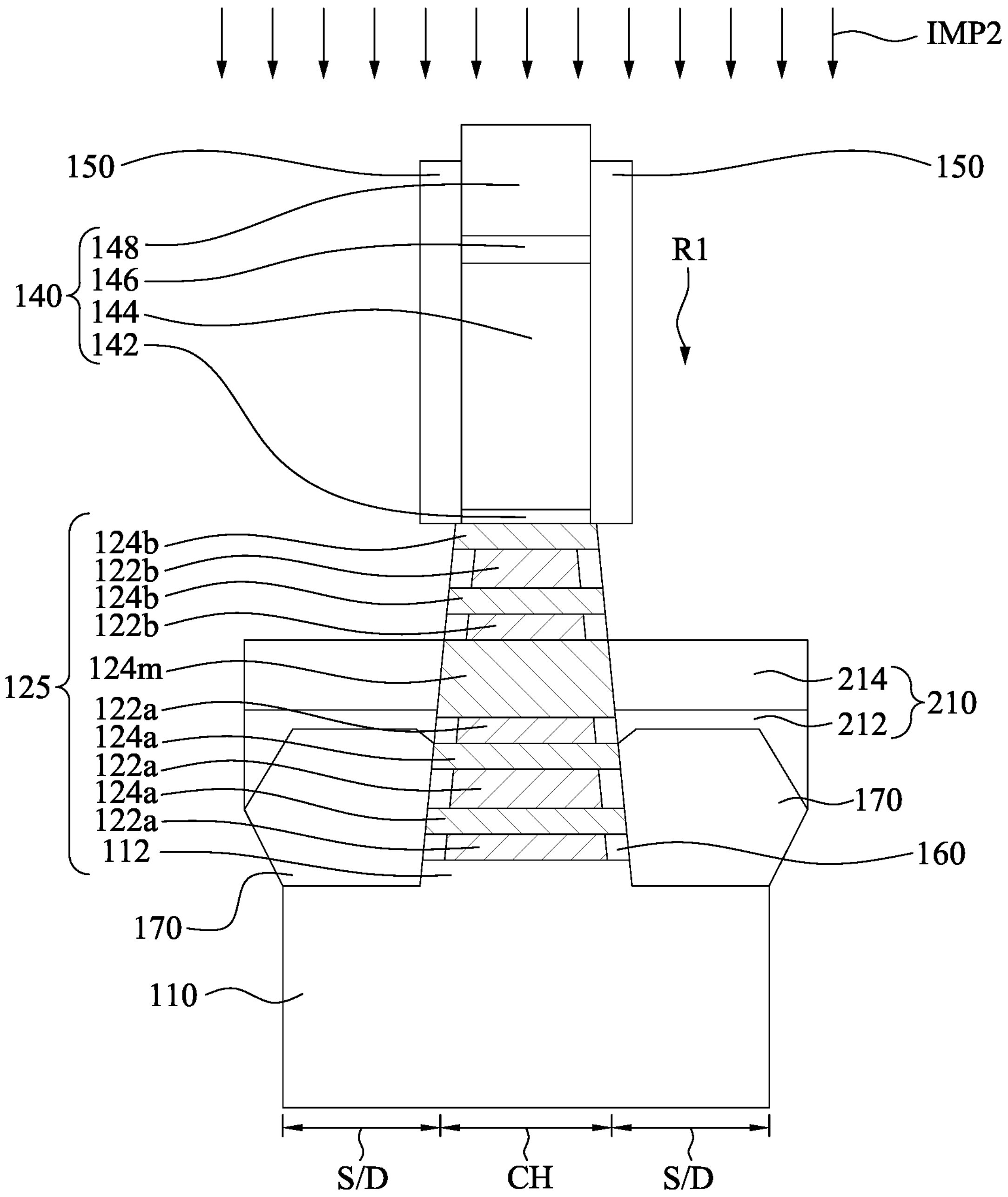

Reference is made to FIGS. 8 and 9A. An ion implantation process IMP2 is performed to dope one or more impurities (e.g., dopant ions) into the second dielectric layers 214'. For example, diffusion-blocking dopants (e.g., carbon, fluorine, xenon, silicon, nitrogen, oxygen, sulfur, other suitable species that is able to prevent the dopants in the second source/drain epitaxial structures 175 (see FIG. 10) from diffusing, or combinations thereof) can be implanted into the second dielectric layers 214', thus forming second doped dielectric layers 214. As such, the first doped dielectric layers 212 and the second doped dielectric layers 214 form a doped isolation structure 210. The fabrication process details about the ion implantation process IMP2 are similar to that about the ion implantation process IMP1, and thus they are not repeated herein for the sake of brevity. The diffusion-blocking dopants in the first doped dielectric layers 212 may be the same as or different from the diffusion-blocking dopants in the second doped dielectric layers 214.

Figure 9B:
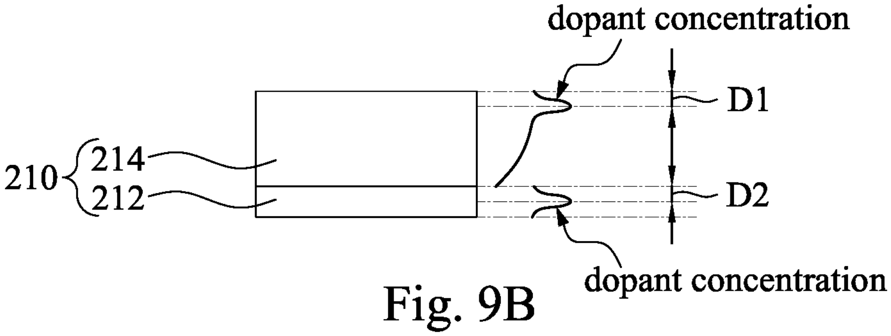

FIG. 9B illustrates a concentration profile of the dopants in the doped isolation structure 210 along a thickness direction of the doped isolation structure 210. In some embodiments, sufficient amounts of the dopants may be in the doped isolation structure 210 with a sufficient thickness of the implanted region. In some embodiments, the doped isolation structure 210 may have an average atomic concentration of the dopants of about 1E19 atoms/cm$^3$ to about 1E22 atoms/cm$^3$. In some embodiments, a distance D1 from a top surface of the second doped dielectric layers 214 along its thickness direction to a concentration peak of the dopants in the second doped dielectric layers 214 is about 1 nm to about 50 nm, and a distance D2 from a top surface of the first doped dielectric layers 212 along its thickness direction to a concentration peak of the dopants in the first doped dielectric layers 212 is about 1 nm to about 50 nm.

Figure 10:
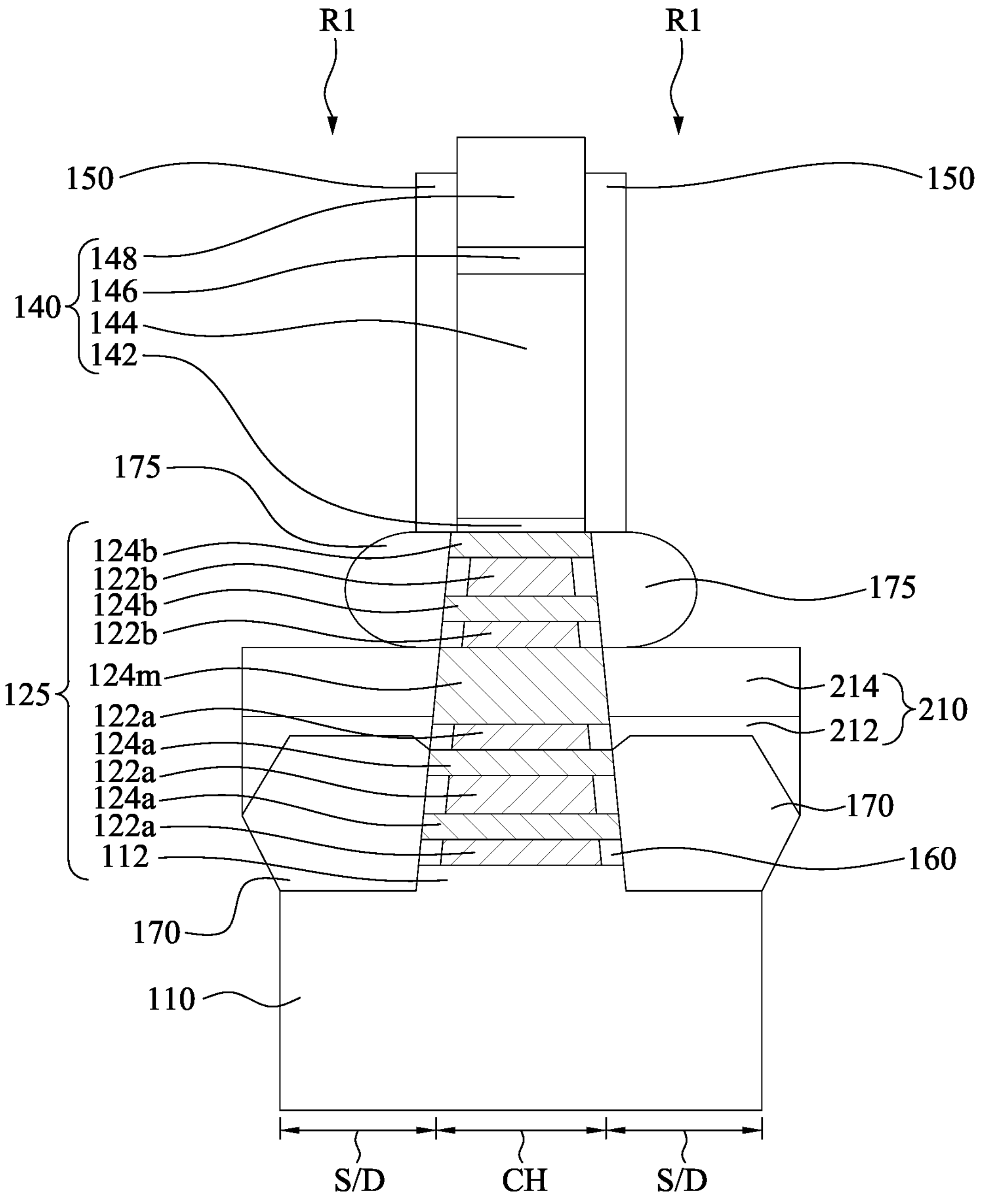

Reference is made to FIG. 10. Second source/drain epitaxial structures 175 are formed over the doped isolation structure 210. The second source/drain epitaxial structures 175 may be formed by performing an epitaxial growth process that provides an epitaxial material on the doped isolation structure 210. During the epitaxial growth process, the dummy gate structure 140, the gate spacers 150, and the inner dielectric spacers 160 limit the second source/drain epitaxial structures 175 to the source/drain regions S/D. In some embodiments, the lattice constants of the second source/drain epitaxial structures 175 are different from the lattice constant of the epitaxial layers **124*b*, so that the epitaxial layers 124*b* can be strained or stressed by the second source/drain epitaxial structures 175 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124*b***.

In some embodiments, the second source/drain epitaxial structures 175 may include Ge, Si, GaAs, AlGaAs, SiGe, GaAsP, SiP, or other suitable material. The second source/drain epitaxial structures 175 may be in-situ doped during the epitaxial process by introducing doping species including: p-type dopants, such as boron or $BF_2$; n-type dopants, such as phosphorus or arsenic; and/or other suitable dopants including combinations thereof. If the second source/drain epitaxial structures 175 are not in-situ doped, an implantation process (i.e., a junction implant process) is performed to dope the second source/drain epitaxial structures 175. In some exemplary embodiments, the second source/drain epitaxial structures 175 in an n-type transistor include SiP, SiAs, SiP+SiAs/SiSb, SiSb, or SiP+SiAs+SiSb. The first source/drain epitaxial structures 170 and the second source/drain epitaxial structures 175 are made of different materials. For example, the first source/drain epitaxial structures 170 are made of SiGeB and the second source/drain epitaxial structures 175 are made of SiP.

Figure 11A:
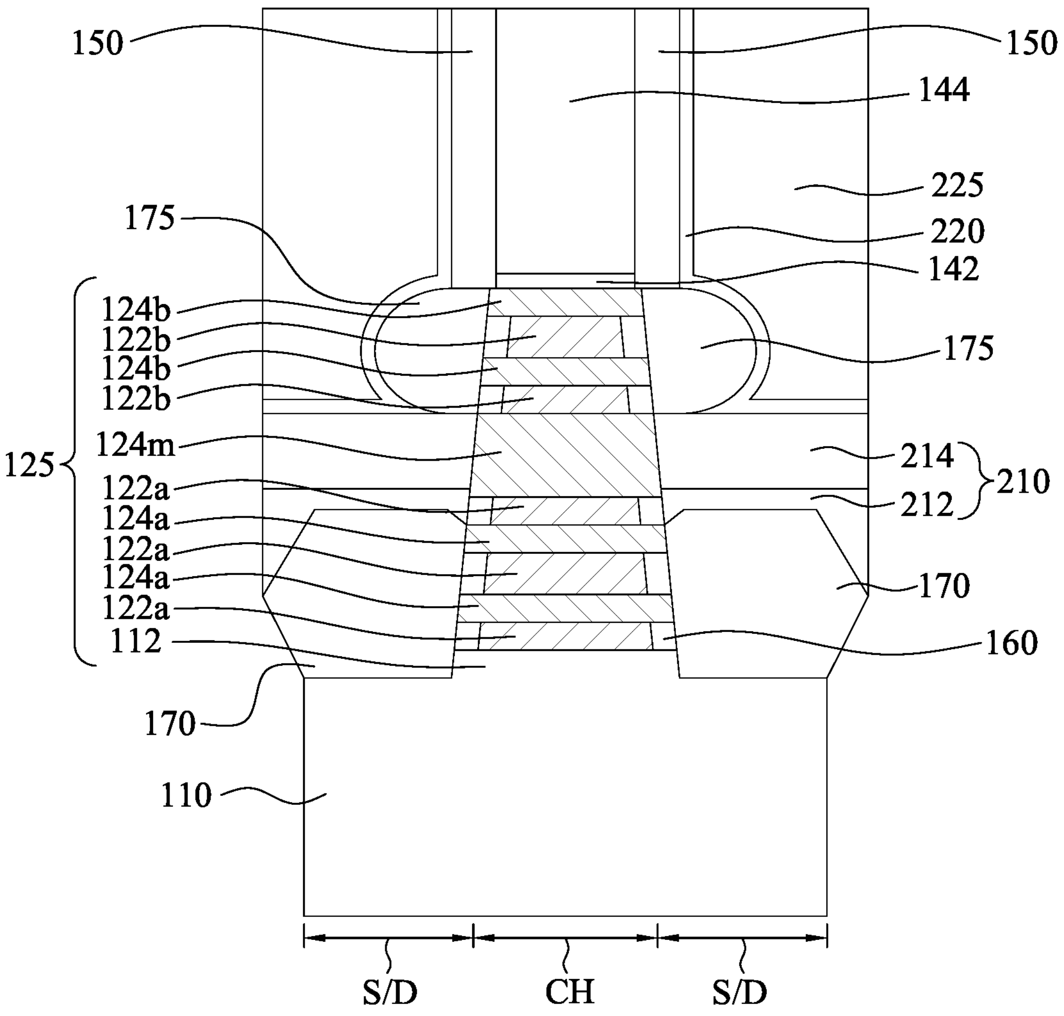
Figure 11B:
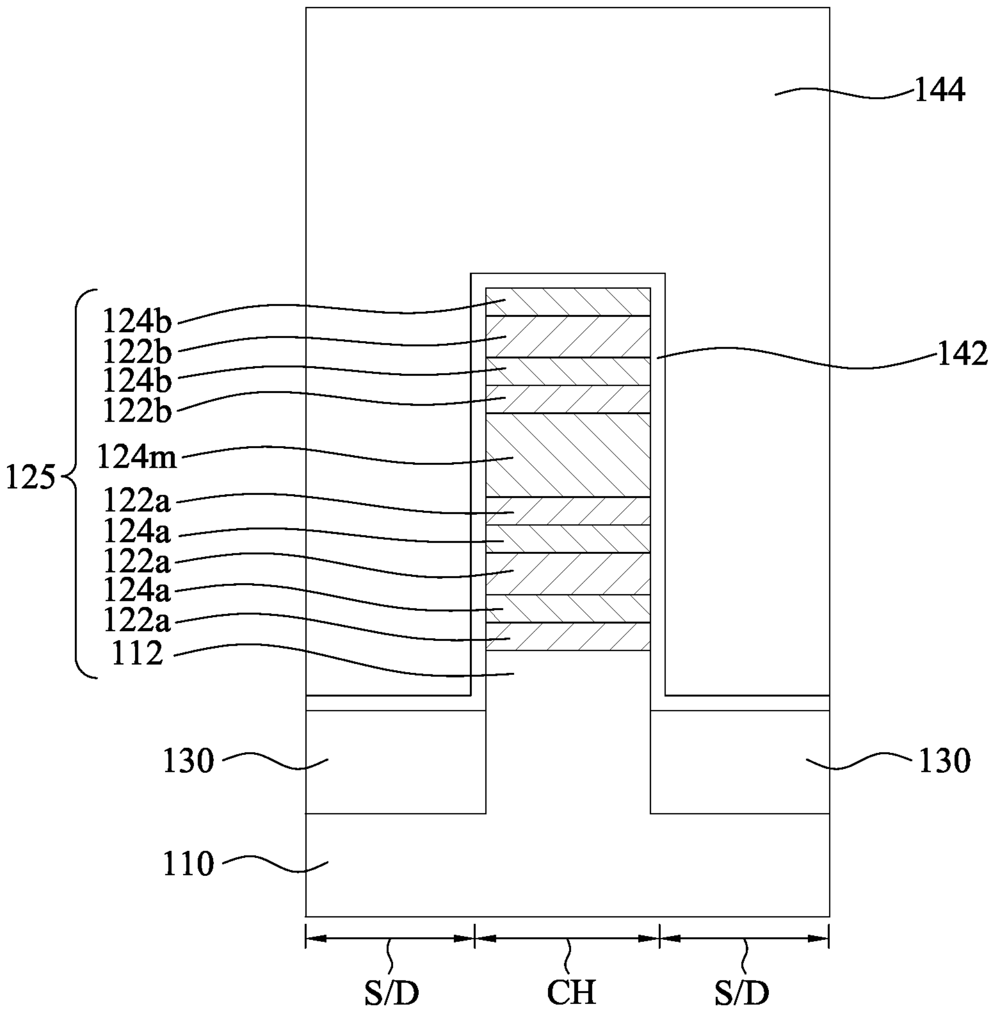

Reference is made to FIGS. 11A and 11B. An interlayer dielectric (ILD) layer 225 is formed on the substrate 110. In some embodiments, a contact etch stop layer (CESL) 220 is also formed prior to forming the ILD layer 225. In some examples, the CESL 220 includes a silicon nitride layer, silicon oxide layer, a silicon oxynitride layer, and/or other suitable materials having a different etch selectivity than the ILD layer 225. The CESL 220 may be formed by plasma-enhanced chemical vapor deposition (PECVD) process and/or other suitable deposition or oxidation processes. In some embodiments, the ILD layer 225 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 220. The ILD layer 225 may be deposited by a PECVD process or other suitable deposition technique. In some embodiments, after formation of the ILD layer 225, the wafer may be subject to a high thermal budget process to anneal the ILD layer 225. It is noted that the existence of the doped isolation structure 210 reduces the aspect ratio of the recesses R1 such that the ILD layer 225 can be filled in the recesses R1 easily.

In some examples, after depositing the ILD layer 225, a planarization process may be performed to remove excessive materials of the ILD layer 225. For example, a planarization process includes a chemical mechanical planarization (CMP) process which removes portions of the ILD layer 225 (and CESL 220, if present) overlying the dummy gate structures 140 and planarizes a top surface of the integrated circuit structure 100*a*. In some embodiments, the CMP process also removes hard mask layers 146 and 148 (as shown in FIG. 10) and exposes the dummy gate electrode layer 144.

Reference is made to FIGS. 11A, 11B, 12A, and 12B. Thereafter, the dummy gate electrode layer 144 and the gate dielectric layer 142 are removed first, and then the epitaxial layers (i.e., sacrificial layers) 122*a* and 122*b* are removed. In some embodiments, the dummy gate electrode layer 144 and the gate dielectric layer 142 are removed by using a selective etching process (e.g., selective dry etching, selective wet etching, or combinations thereof) that etches the materials in dummy gate electrode layer 144 and the gate dielectric layer 142 at a faster etch rate than it etches other materials (e.g., the gate spacers 150 and/or the ILD layer 225), thus resulting in a gate trench GT1 between the gate spacers 150, with the epitaxial layers 122*a* and 122*b* exposed in the gate trench GT1. Subsequently, the epitaxial layers 122*a* and 122*b* in the gate trench GT1 are removed by using another selective etching process that etches the epitaxial layers 122*a* and 122*b* at a faster etch rate than it etches the epitaxial layers 124*a*. 124*b*, and 124*m*, thus forming openings between neighboring epitaxial layers (i.e., channel layers) 124*a* and 124*b*. In this way, the epitaxial layers 124*a*, 124*b*, and 124*m* become nanosheets suspended over the substrate 110. This operation is also called a channel release process. In some embodiments, the epitaxial layers 124*a*, 124*b*, and 124*m* can be interchangeably referred to as nanostructure (nanowires, nanoslabs and nanorings, nanosheet, etc., depending on their geometry). For example, in some other embodiments the epitaxial layers 124*a*, 124*b*, and 124*m* may be trimmed to have a substantial rounded shape (i.e., cylindrical) due to the selective etching process for completely removing the epitaxial layers 122*a* and 122*b*. In that case, the resultant epitaxial layers 124*a*. 124*b*, and 124*m* can be called nanowires.

In some embodiments, the epitaxial layers 122*a* and 122*b* are removed by using a selective dry etching process by using, for example, $CF_4$ as etching gases. In some embodiments, the epitaxial layers 122*a* and 122*b* are SiGe and the epitaxial layers 124*a*, 124*b*, and 124*m* are silicon allowing for the selective removal of the epitaxial layers 122*a* and 122*b*.

A (metal) gate structure 230 is formed in the gate trench GT1 and the openings to surround each of the epitaxial layers 124*a*, 124*b*, and 124*m* suspended in the gate trench GT1 and the openings. The gate structure 230 may be the final gate of a GAA FET. The final gate structure may be a high-k/metal gate stack, however other compositions are possible. In some embodiments, the gate structure 230 forms the gate associated with the multi-channels provided by the plurality of epitaxial layers 124*a* and 124*b*. For example, the gate structure 230 is formed within the openings provided by the release of epitaxial layers 124*a*, 124*b*, and 124*m*. In various embodiments, the gate structure 230 includes a gate dielectric layer 232 formed around the epitaxial layers 124*a*, 124*b*, and 124*m*, a work function metal layer 234 formed around the gate dielectric layer 232, and a fill metal 236 formed around the work function metal layer 234 and filling a remainder of gate trench GT1. The gate dielectric layer 232 includes an interfacial layer (e.g., silicon oxide layer) and a high-k gate dielectric layer over the interfacial layer. High-k gate dielectrics include dielectric materials having a high dielectric constant, for example, greater than that of thermal silicon oxide (~3.9). The work function metal layer 234 and/or fill metal 236 used within high-k/metal gate structures 230 may include a metal, metal alloy, or metal silicide. Formation of the gate structures 230 may include depositions to form various gate materials, one or more liner layers, and one or more CMP processes to remove excessive gate materials.

In some embodiments, the interfacial layer of the gate dielectric layer 232 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 232 may include hafnium oxide ($HfO_2$). Alternatively, the gate dielectric layer 232 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 234 may include work function metals to provide a suitable work function for the gate structure 230. For an n-type FinFET, the work function metal layer 234 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 234 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 236 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Reference is made to FIG. 13. After the formation of the gate structure 230 as shown in FIGS. 12A and 12B, an etching back process is optionally performed to etch back the gate structures 230, resulting in a recess over the etched-back gate structure 230. In some embodiments, because the materials of the gate structures 230 have a different etch selectivity than the gate spacers 150, a selective etching process may be performed to etch back the gate structures 230 to lower the gate structures 230. As a result, the top surface of the gate structure 230 may be at a lower level than the top surfaces of the gate spacers 150.

Subsequently, a dielectric cap layer is deposited over the substrate 110 until the recess is overfilled. The dielectric cap layer includes $SiN_x$, $Al_xO_y$, AlON, $SiO_xC_y$, $SiC_xN_y$, boron nitride (BN), boron carbonitride (BNC), combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recess, leaving portions of the dielectric cap layer in the recess to serve as a dielectric cap 240. The dielectric cap 240 is in direct contact with the gate structure 230 as shown in FIG. 13.

Next, openings are formed in the ILD layer 225. The opening exposes either the first source/drain epitaxial structures 170 or the second source/drain epitaxial structures 175. Contacts 250 and 255 are then respectively formed in the openings. In some embodiments, prior to the formation of the contacts 250 and 255, metal alloy layers are formed in the openings and on the exposed portions of the first source/drain epitaxial structures 170 and the second source/drain epitaxial structures 175. Each of the contacts 250 is connected to the first source/drain epitaxial structure 170, and each of the contacts 255 is connected to the second source/drain epitaxial structure 175. Formation of the contacts 250 and 255 includes depositing one or more conductive (e.g., metal) materials overfilling the openings and then performing a CMP process to remove excessive metal materials outside the openings.

Reference is made to FIG. 14. In some other embodiments, after the formation of the dielectric cap 240, the contacts 255 are formed in the ILD layer 225 to be electrically connected to the second source/drain epitaxial structures 175. Subsequently, the substrate 110 (as shown in FIGS. 12A and 12B) is removed, such that the backside of the gate structure 230 and the backside of the first source/drain epitaxial structures 170 are exposed. A dielectric isolation layer 260 is then deposited to cover the backside of the gate structure 230 and the backside of the first source/drain epitaxial structures 170. In some embodiments, the dielectric isolation layer 260 is made of materials the same as or similar to that of the ILD layer 225.

Next, backside vias 270 are formed in the dielectric isolation layer 260 to be electrically connected to the first source/drain epitaxial structures 170. In some embodiments, openings are formed in the dielectric isolation layer 260. The opening exposes the first source/drain epitaxial structures 170. The backside vias 270 are then respectively formed in the openings. In some embodiments, prior to the formation of the backside vias 270, metal alloy layers are formed in the openings and on the exposed portions of the first source/drain epitaxial structures 170. Each of the backside vias 270 is connected to the first source/drain epitaxial structure 170. Formation of the backside vias 270 includes depositing one or more conductive (e.g., metal) materials overfilling the openings and then performing a CMP process to remove excessive metal materials outside the openings.

As such, the semiconductor device 100*a* is formed. As shown in FIGS. 13 and 14, the semiconductor device 100*a* includes a bottom transistor Tb, a top transistor Tt, and doped isolation structures 210. The top transistor Tt is over the bottom transistor Tb. The bottom transistor Tb includes the channel layers 124*a*, the first source/drain epitaxial structures 170 on opposite sides of the channel layers 124*a* and connected to the channel layers 124*a*, and the gate structure 230 wrapping around the channel layers 124*a*. The top transistor Tt includes the channel layers 124*b*, the second source/drain epitaxial structures 175 on opposite sides of the channel layers 124*b* and connected to the channel layers 124*b*, and the gate structure 230 wrapping around the channel layers 124*b*. The bottom transistor Tb is a P-type transistor, and the top transistor Tt is an N-type transistor, or vice versa. Each of the doped isolation structures 210 is between one of the first source/drain epitaxial structures 170 and one of the second source/drain epitaxial structures 175 to electrically isolate the first source/drain epitaxial structure 170 from the second source/drain epitaxial structure 175. Further, the doped isolation structures 210 is configured to prevent the N-type dopants and/or P-type dopants in the first source/drain epitaxial structures 170 and the second source/drain epitaxial structures 175 from diffusing, such that the N-type dopants and/or P-type dopants would not be intermixed in the doped isolation structures 210.

Figure 15:
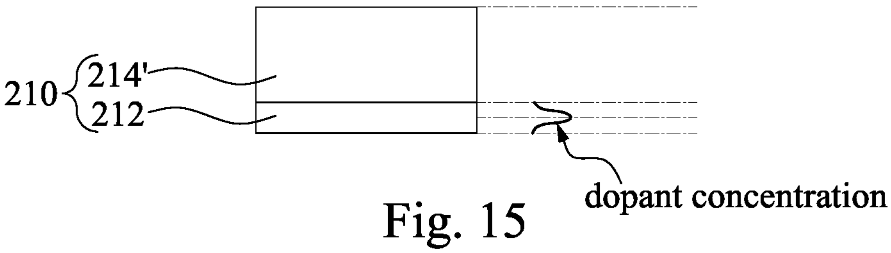
FIG. 15 illustrates a concentration profile of the dopants in the doped isolation structure along a thickness direction of the doped isolation structure according to some embodiments.

FIG. 15 illustrates a concentration profile of the dopants in the doped isolation structure 210 along a thickness direction of the doped isolation structure 210 according to some embodiments. In some embodiments, the ion implantation process IMP2 in FIG. 9A is omitted. As such, the second dielectric layers 214' are undoped while the first dielectric layers 212 are doped. Other features of the doped isolation structure 210 in FIG. 15 are similar to or the same as those of the doped isolation structure 210 in FIG. 9B, and therefore, a description in this regard will not be provided hereinafter.

Figure 16:
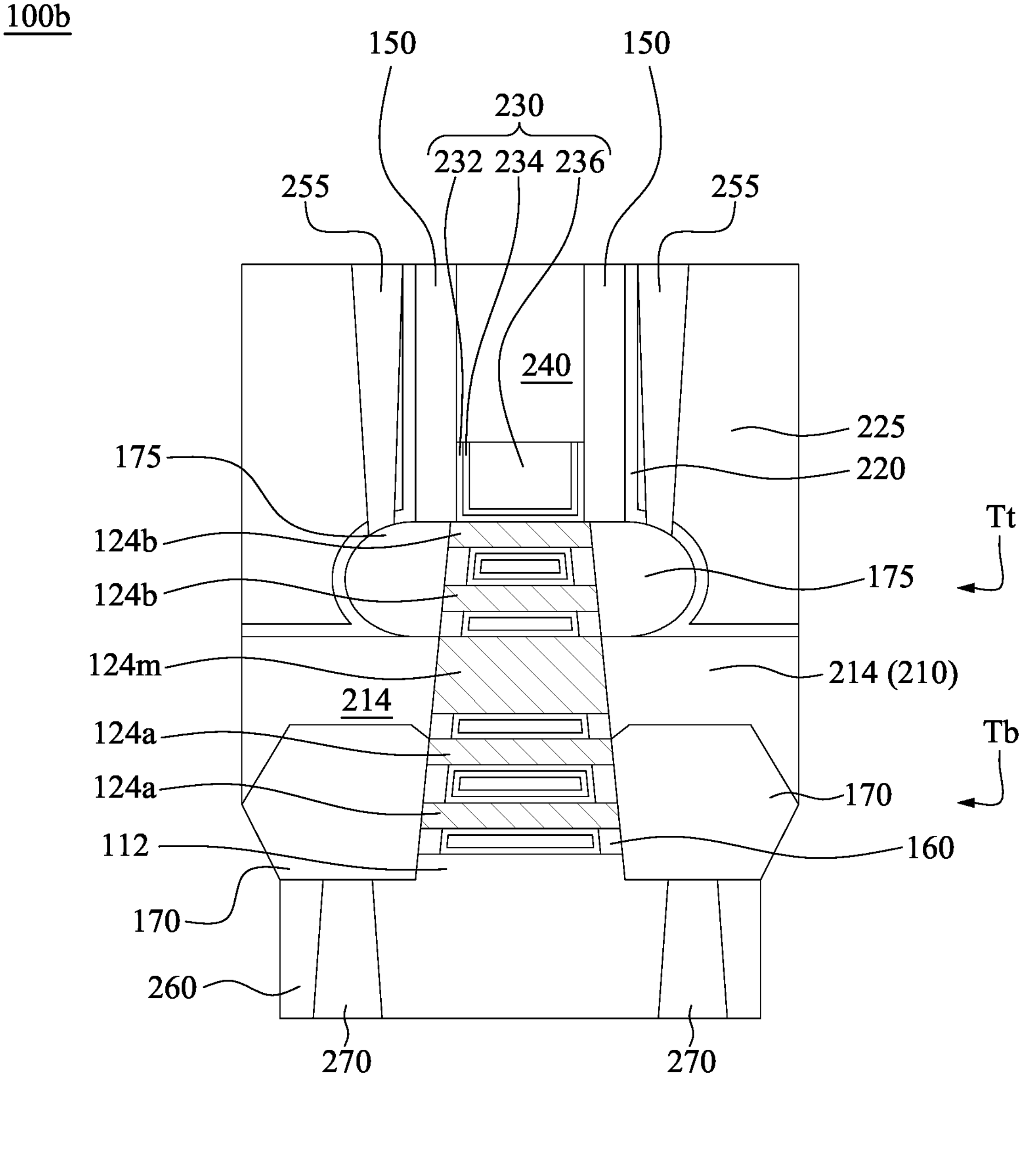
FIG. 16 is a cross-sectional view of an integrated circuit structure (or a semiconductor device) in accordance with some embodiments of the present disclosure.

FIG. 16 is a cross-sectional view of an integrated circuit structure (or a semiconductor device) 100*b* in accordance with some embodiments of the present disclosure. The difference between the integrated circuit structures 100*b* and 100*a* (see FIGS. 13 and 14) pertains to the configuration of the doped isolation structure 210. In FIG. 16, the first doped dielectric layers 212 are omitted. As such, the second doped dielectric layers 214 are in contact with the first source/drain epitaxial structures 170 and the second source/drain epitaxial structures 175. Other features of the integrated circuit structure 100*b* are similar to or the same as those of the integrated circuit structure 100*a*, and therefore, a description in this regard will not be provided hereinafter.

Figure 17A:
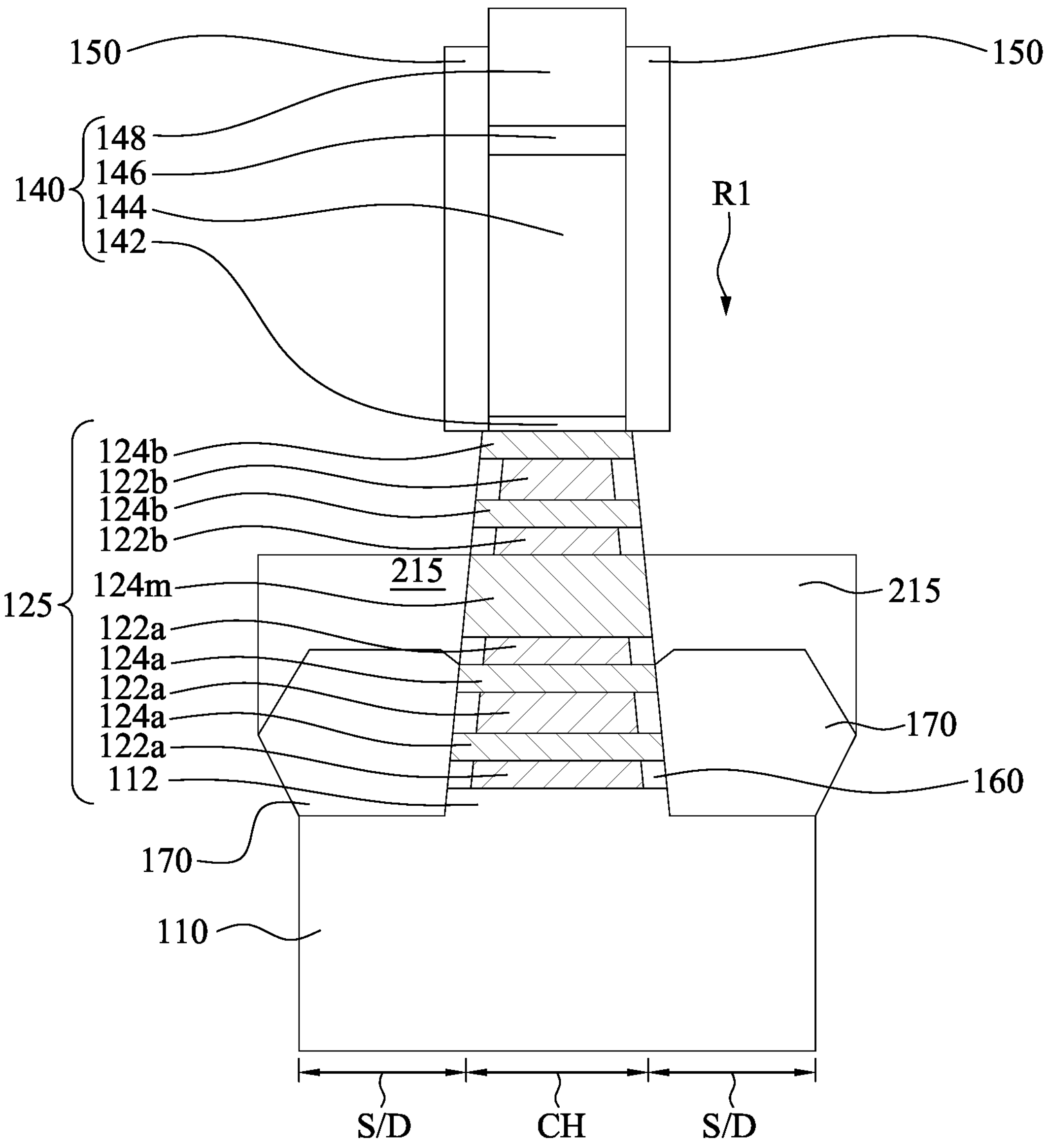
FIGS. 17A-18 illustrate cross-sectional views of intermediate stages in the formation of an integrated circuit structure (or a semiconductor device) in accordance with some embodiments of the present disclosure.
Figure 17B:
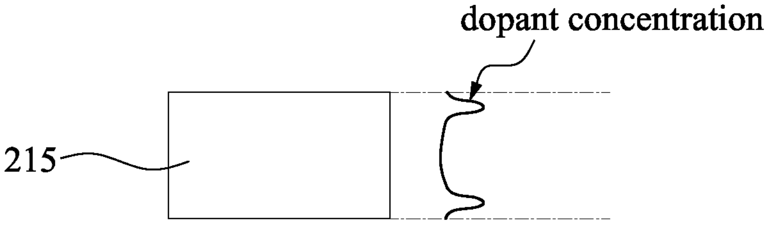
Figure 18:
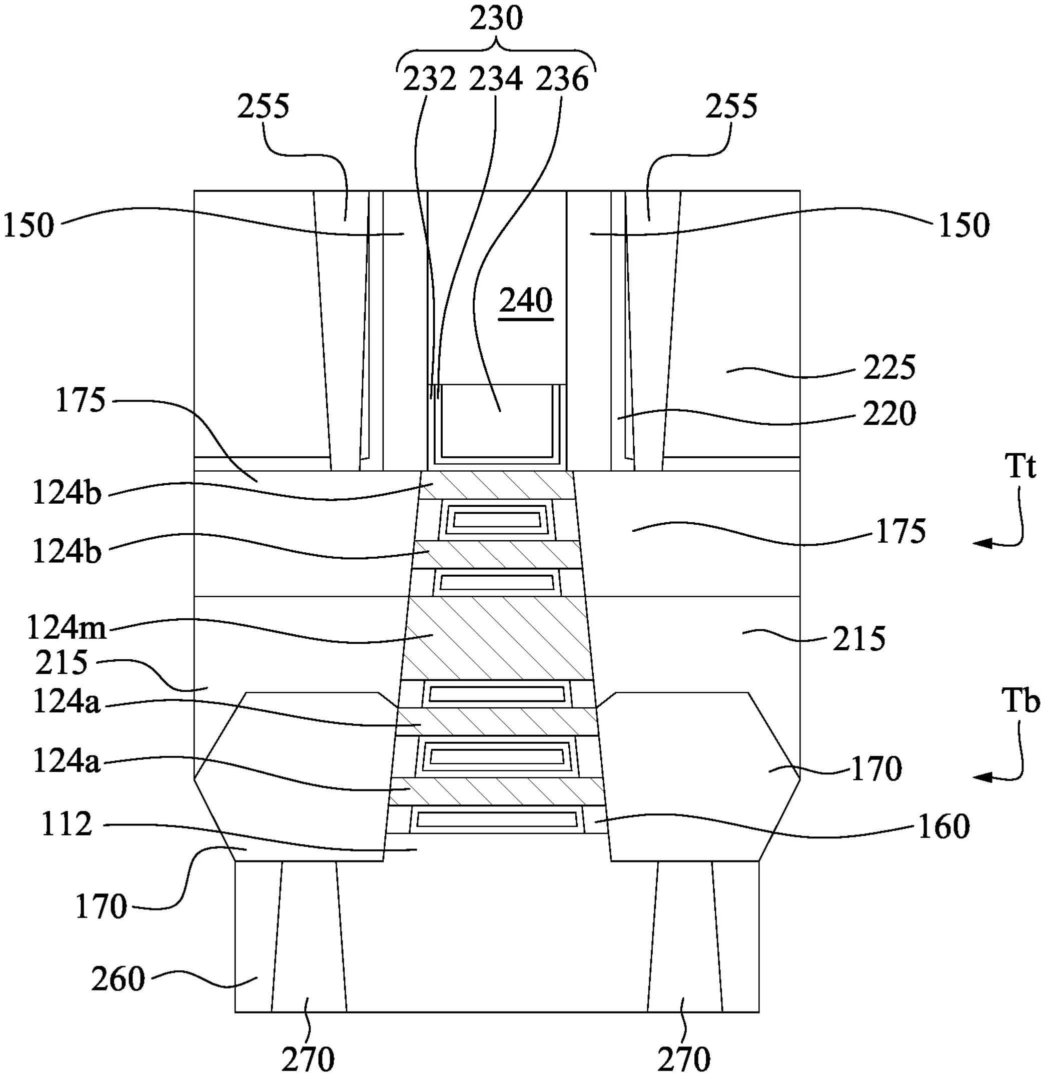

FIGS. 17A-18 illustrate cross-sectional views of intermediate stages in the formation of an integrated circuit structure (or a semiconductor device) 100*c* in accordance with some embodiments of the present disclosure. In some embodiments, after the structure as shown in FIG. 5 is formed, semiconductive isolation layers 215 are deposited over the first source/drain epitaxial structures 170, respectively. In some embodiments, semiconductive materials are deposited on the first source/drain epitaxial structures 170 to form the semiconductive isolation layers 215. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide (GaAs). For example, the semiconductive materials are substantially pure silicon (silicon concentration is greater than about 99%, not including the diffusion-blocking dopants mentioned below) or SiGe, where the germanium concentration of the semiconductive materials is lower than the (minimum) germanium concentration of the first source/drain epitaxial structures 170. The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the semiconductive isolation layers 215 are intrinsic. That is, the semiconductive isolation layers 215 are undoped with N-type dopants and P-type dopants, such that the semiconductive isolation layers 215 are benefit for reducing current leakage from the first source/drain epitaxial structures 170 to the second source/drain epitaxial structures 175 (see FIG. 18).

Further, the semiconductive isolation layers 215 are in-situ doped with diffusion-blocking dopants (e.g., carbon, fluorine, xenon, silicon, nitrogen, oxygen, sulfur, other suitable species that is able to prevent the dopants in the first source/drain epitaxial structures 170 from diffusing, or combinations thereof) during the deposition of the semiconductive isolation layers 215. As shown in FIG. 17B, which illustrates a concentration profile of the dopants in the semiconductive isolation layers 215 along a thickness direction of the semiconductive isolation layers 215, the dopant concentration can be varied along the thickness direction, such that the dopants have high concentrations near the first source/drain epitaxial structures 170 and the second source/drain epitaxial structures 175. For example, a concentration of the diffusion-blocking dopants in a middle of the semiconductive isolation layer 215 is lower than a concentration of the diffusion-blocking dopants in a bottom of the semiconductive isolation layer 215 and lower than a concentration of the diffusion-blocking dopants in a top of the semiconductive isolation layer 215. In some embodiments, carbon atoms (diffusion-blocking dopants) are doped into the semiconductive isolation layers 215, and the carbon atomic concentration in the semiconductive isolation layers 215 is greater than 0 and less than or equal to about 20%.

In some embodiments, during the deposition of the semiconductive isolation layers 215, another protection layer (like the protection layer 105 in FIG. 5) may be deposited over first source/drain epitaxial structures 170 to covers the epitaxial layers 124*b* but exposes the epitaxial layer 124*m* and the first source/drain epitaxial structures 170. After the formation of the semiconductive isolation layers 215, the protection layer may be removed as shown in FIG. 17A.

Reference is made to FIG. 18. After the formation of the semiconductive isolation layers 215, the structure of FIG. 17A undergoes the processes shown in FIGS. 10-12B and 13 or FIGS. 10-12B and 14 to complete the formation of the integrated circuit structure (or a semiconductor device) 100*c* as shown in FIG. 18. As such, the semiconductive isolation layers 215 are further in contact with the second source/drain epitaxial structures 175 as shown in FIG. 18. It is noted that since the semiconductive isolation layers 215 are epitaxial semiconductor materials, the second source/drain epitaxial structures 175 also grow from the semiconductive isolation layers 215, such that the epitaxial growth rate of the second source/drain epitaxial structures 175 can be increased. In addition, the formation of the first source/drain epitaxial structures 170, the semiconductive isolation layers 215, and the second source/drain epitaxial structures 175 may be in-situ epitaxially grown in sequence (in a non-stop way), such that the particle control thereof can be improved. Other features of the integrated circuit structure 100*c* in FIG. 18 are similar to or the same as those of the integrated circuit structure 100*a* in FIGS. 13 and 14, and therefore, a description in this regard will not be provided hereinafter.

Figure 19:
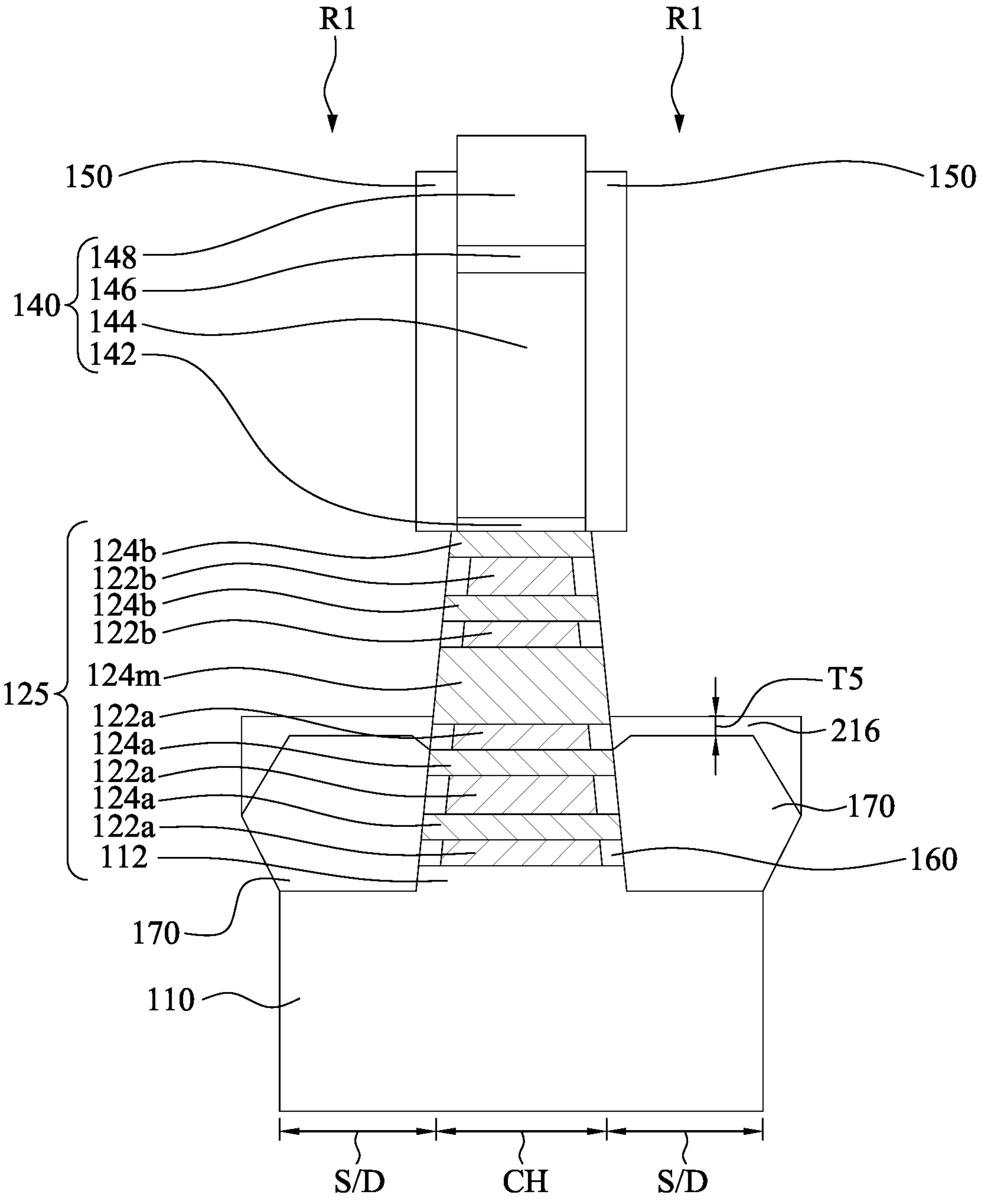
FIGS. 19-21 illustrate perspective views and cross-sectional views of intermediate stages in the formation of an integrated circuit structure (or a semiconductor device) in accordance with some embodiments of the present disclosure.
Figure 20A:
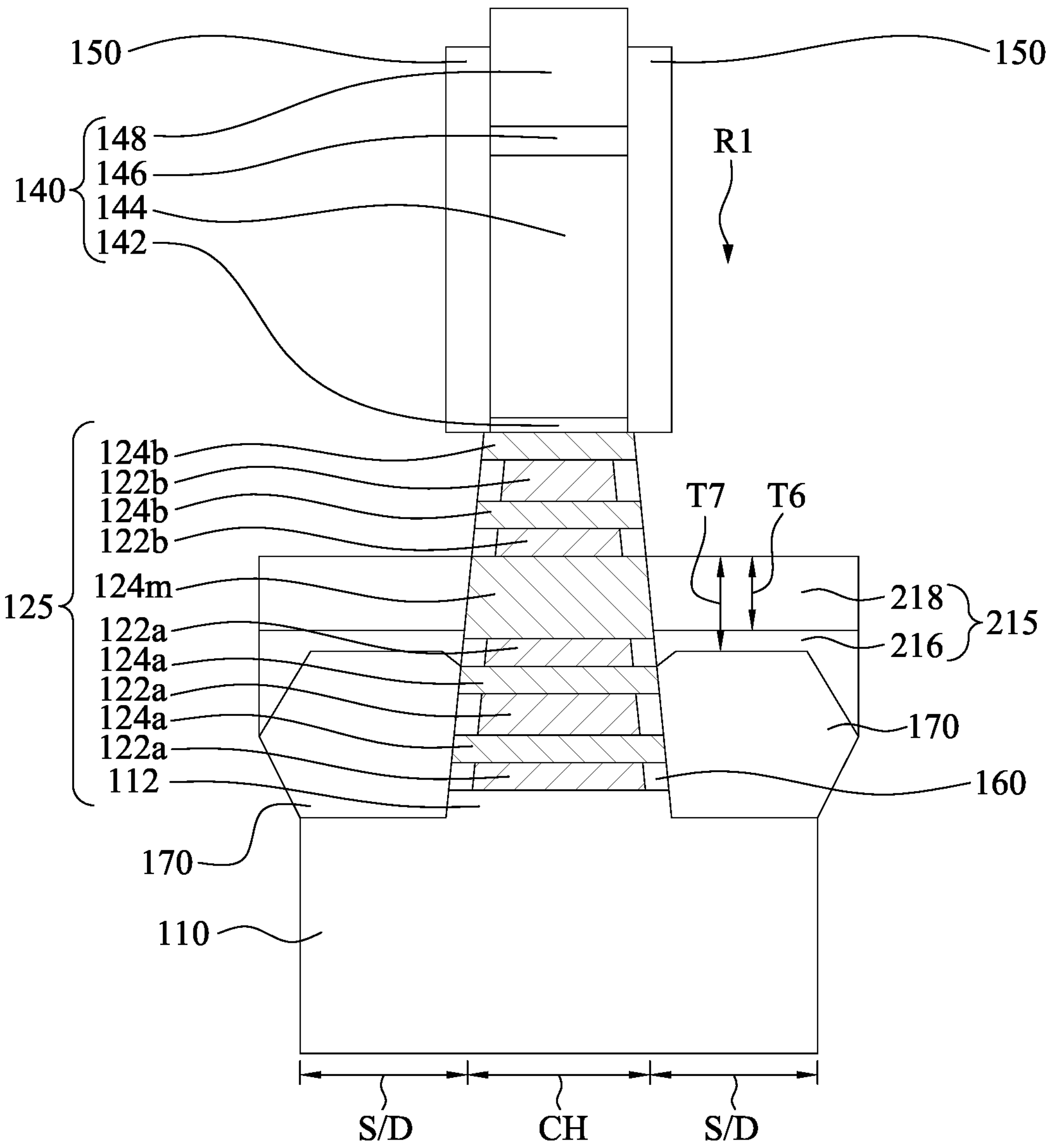
Figure 20B:
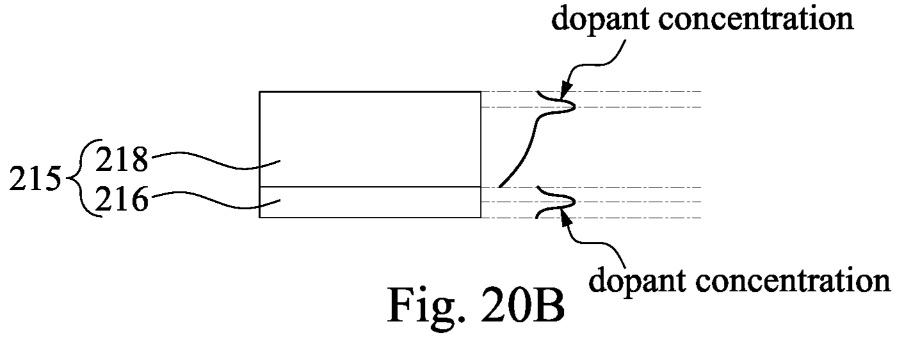
Figure 21:
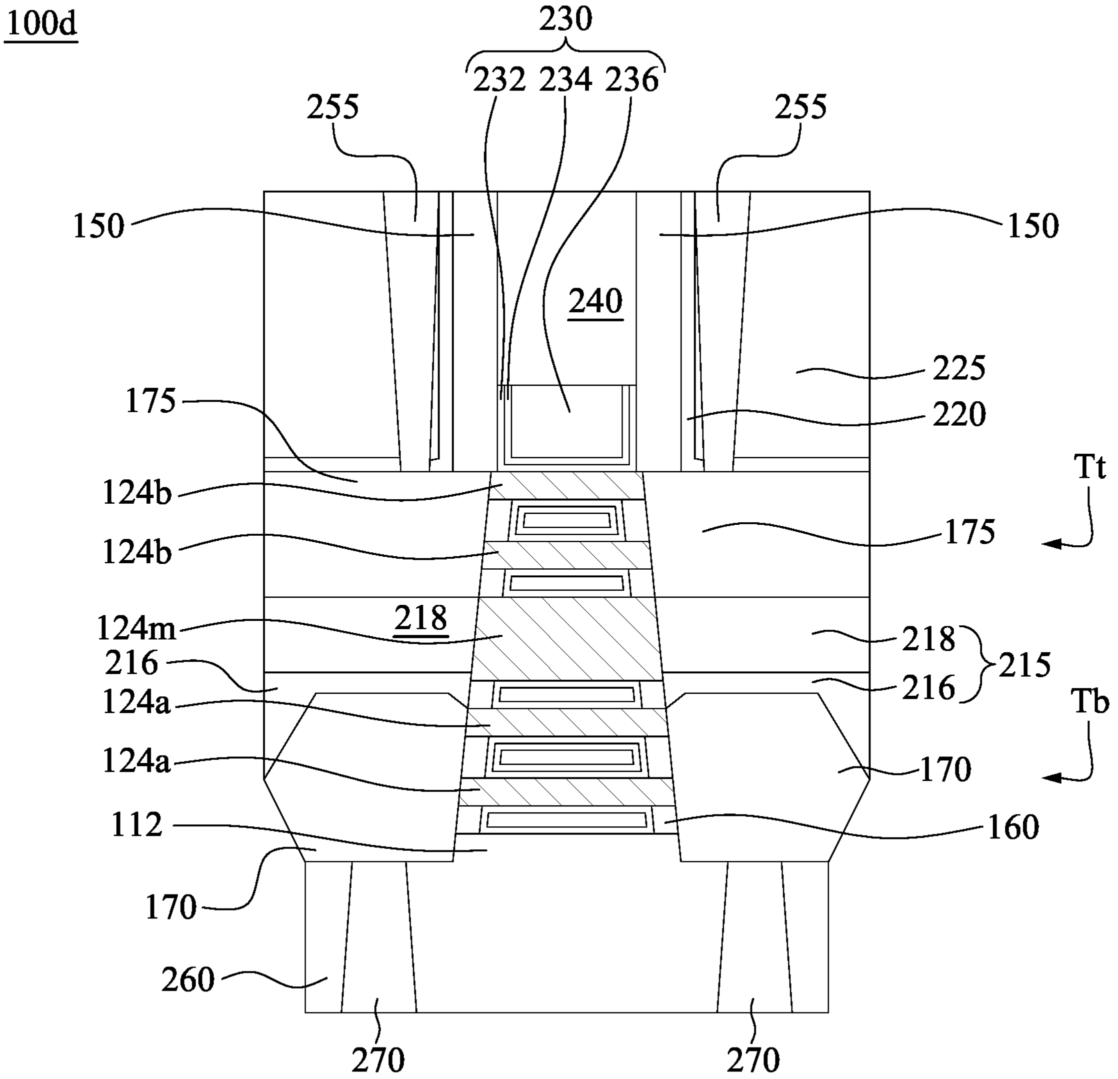

FIGS. 19-21 illustrate perspective views and cross-sectional views of intermediate stages in the formation of an integrated circuit structure (or a semiconductor device) 100*d* in accordance with some embodiments of the present disclosure. In some embodiments, after the structure as shown in FIG. 5 is formed, first doped epitaxial layers 216 are deposited over and in contact with the first source/drain epitaxial structures 170, respectively, as shown in FIG. 19. In some embodiments, semiconductive materials are deposited on the first source/drain epitaxial structures 170 to form first undoped epitaxial layers. The semiconductor materials may be the same or similar to the semiconductor materials mentioned in FIG. 17A. The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the first undoped epitaxial layers are intrinsic. That is, the first undoped epitaxial layers are undoped with N-type dopants and P-type dopants, such that the first undoped epitaxial layers are benefit for reducing current leakage from the first source/drain epitaxial structures 170 to the second source/drain epitaxial structures 175 (see FIG. 21).

After the formation of the first undoped epitaxial layers, an ion implantation process is performed to dope one or more impurities (e.g., dopant ions) into the first undoped epitaxial layers. For example, diffusion-blocking dopants (e.g., carbon, fluorine, xenon, silicon, nitrogen, oxygen, sulfur, other suitable species that is able to prevent the dopants in the first source/drain epitaxial structures 170 from diffusing, or combinations thereof) can be implanted into the first undoped epitaxial layers, thus forming first doped epitaxial layers 216. The fabrication process details about the ion implantation process are similar to that about the ion implantation process IMP1, and thus they are not repeated herein for the sake of brevity. In some embodiments, the first doped epitaxial layers 216 (especially the portion of the first doped epitaxial layers 216 over the topmost portion of the first source/drain epitaxial structures 170) have a thickness T5 in a range from about 2 nm to about 80 nm.

Reference is made to FIG. 20A. Semiconductive materials are deposited on the first doped epitaxial layers 216 to form second undoped epitaxial layers. The fabrication process details about the formation of the second undoped epitaxial layers are similar to that about the formation of the first undoped epitaxial layers, and thus they are not repeated herein for the sake of brevity.

After the formation of the second undoped epitaxial layers, another ion implantation process is performed to dope one or more impurities (e.g., dopant ions) into the second undoped epitaxial layers. For example, diffusion-blocking dopants (e.g., carbon, fluorine, xenon, silicon, nitrogen, oxygen, sulfur, other suitable species that is able to prevent the dopants in the second source/drain epitaxial structures 175 from diffusing, or combinations thereof) can be implanted into the second undoped epitaxial layers, thus forming second doped epitaxial layers 218. As such, the first doped epitaxial layer 216 and the second doped epitaxial layer 218 form a semiconductive isolation layer 215. The diffusion-blocking dopants in the first doped epitaxial layer 216 may be the same as or different from the diffusion-blocking dopants in the second doped epitaxial layer 218. FIG. 20B illustrates a concentration profile of the dopants in the semiconductive isolation layers 215 along a thickness direction of the semiconductive isolation layers 215. The fabrication process details about the ion implantation process are similar to that about the ion implantation process IMP1, and thus they are not repeated herein for the sake of brevity. In some embodiments, the second doped epitaxial layers 218 have a thickness T6 in a range from about 5 nm to about 150 nm. Further, a thickness T7 of the sum of the semiconductive isolation layer 215 is in a range from about 2 nm to about 250 nm.

Reference is made to FIG. 21. After the formation of the semiconductive isolation layers 215, the structure of FIG. 20A then undergoes the processes shown in FIGS. 10-12B and 13 or FIGS. 10-12B and 14 to complete the formation of the integrated circuit structure (or a semiconductor device) 100*d* as shown in FIG. 21. As such, the semiconductive isolation layers 215 are further in contact with the second source/drain epitaxial structures 175 as shown in FIG. 21. Other features of the integrated circuit structure 100*d* in FIG. 21 are similar to or the same as those of the integrated circuit structure 100*a* in FIGS. 13 and 14, and therefore, a description in this regard will not be provided hereinafter.

Figure 22:
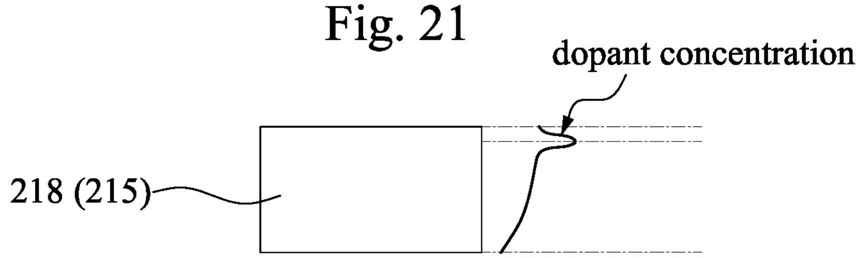
FIG. 22 illustrates a concentration profile of the dopants in the semiconductive isolation layers along a thickness direction of the semiconductive isolation layers according to some embodiments.

FIG. 22 illustrates a concentration profile of the dopants in the semiconductive isolation layers 215 along a thickness direction of the semiconductive isolation layers 215 according to some embodiments. In some embodiments, the formation of the first doped epitaxial layer 216 in FIG. 19 is omitted. As such, the second doped epitaxial layer 218 is in contact with the first source/drain epitaxial structure 170 and the second source/drain epitaxial structure 175. Other features of the semiconductive isolation layers 215 in FIG. 22 are similar to or the same as those of the semiconductive isolation layers 215 in FIG. 21, and therefore, a description in this regard will not be provided hereinafter.

Figure 23:
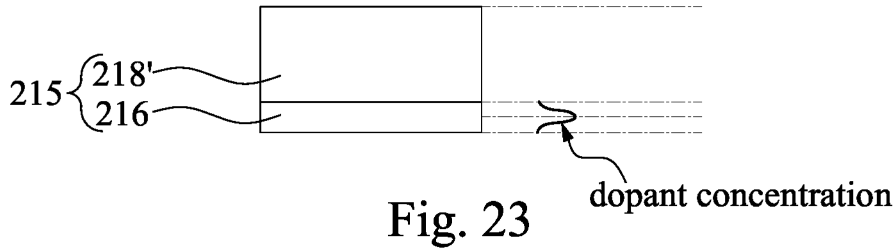
FIG. 23 illustrates a concentration profile of the dopants in the semiconductive isolation layers along a thickness direction of the semiconductive isolation layers according to still some embodiments.

FIG. 23 illustrates a concentration profile of the dopants in the semiconductive isolation layers 215 along a thickness direction of the semiconductive isolation layers 215 according to still some embodiments. In some embodiments, the ion implantation process mentioned in FIG. 20A is omitted. As such, the second epitaxial layer 218' is undoped while the first doped epitaxial layer 216 is doped. Other features of the semiconductive isolation layers 215 in FIG. 23 are similar to or the same as those of the semiconductive isolation layers 215 in FIG. 21, and therefore, a description in this regard will not be provided hereinafter.

Figure 24:
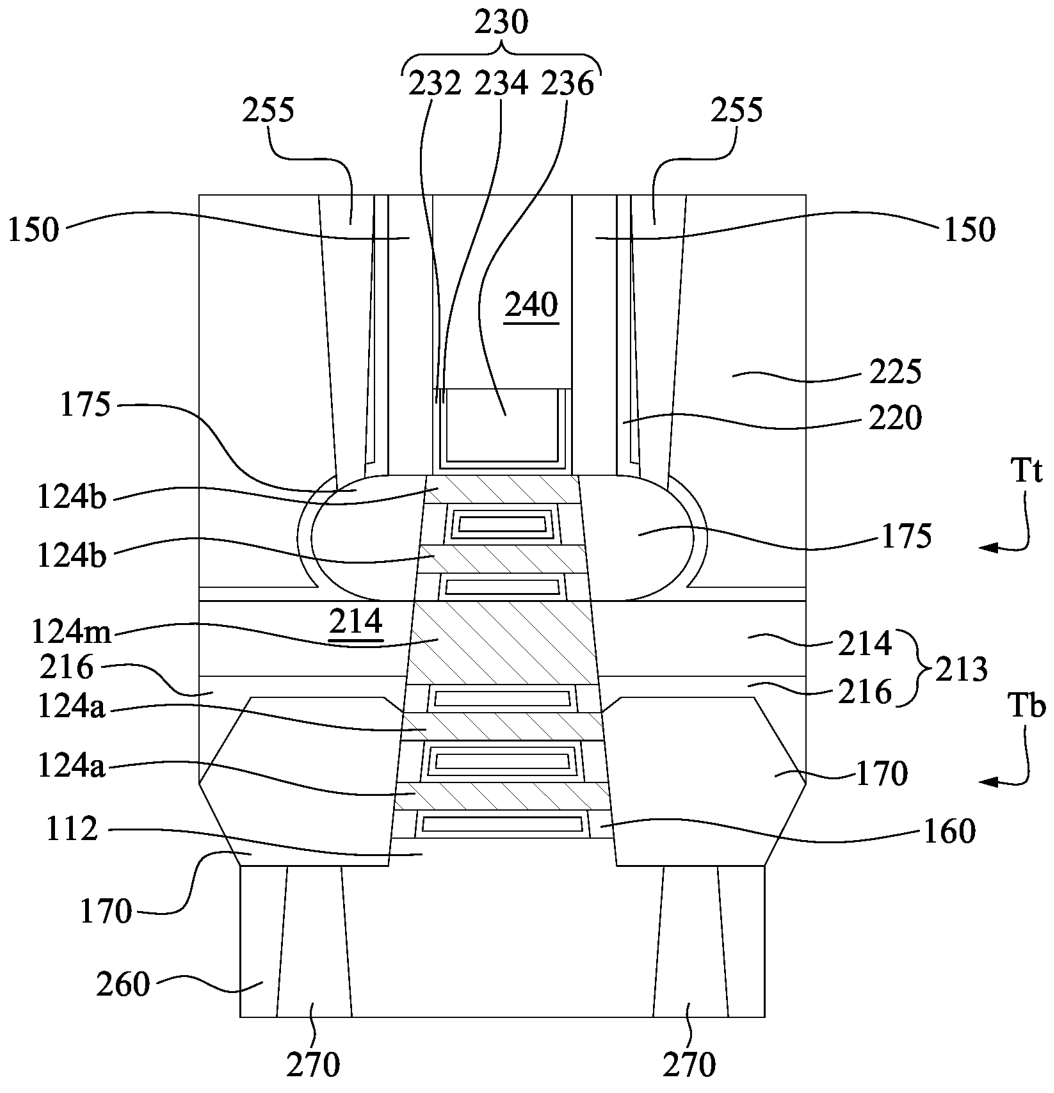
FIG. 24 is a cross-sectional view of an integrated circuit structure (or a semiconductor device) in accordance with some embodiments of the present disclosure.

FIG. 24 is a cross-sectional view of an integrated circuit structure (or a semiconductor device) 100*e* in accordance with some embodiments of the present disclosure. The difference between the integrated circuit structures 100*e* and 100*a* (see FIGS. 13 and 14) pertains to the configuration of the doped isolation structure. In FIG. 24, doped isolation structures 213 are between the first source/drain epitaxial structures 170 and the second source/drain epitaxial structures 175. Each of the doped isolation structures 213 includes the first doped epitaxial layer 216 (see FIG. 19) and the second doped dielectric layer 214 (see FIG. 9A) over the first doped epitaxial layer 216. For example, dielectric layers are formed over the first doped epitaxial layer 216, respectively, and an implantation process is performed to dope diffusion-blocking dopants in the dielectric layers to form the second doped dielectric layer 214. Other features of the integrated circuit structure 100*e* are similar to or the same as those of the integrated circuit structures 100*a* and 100*d*, and therefore, a description in this regard will not be provided hereinafter.

Figure 25:
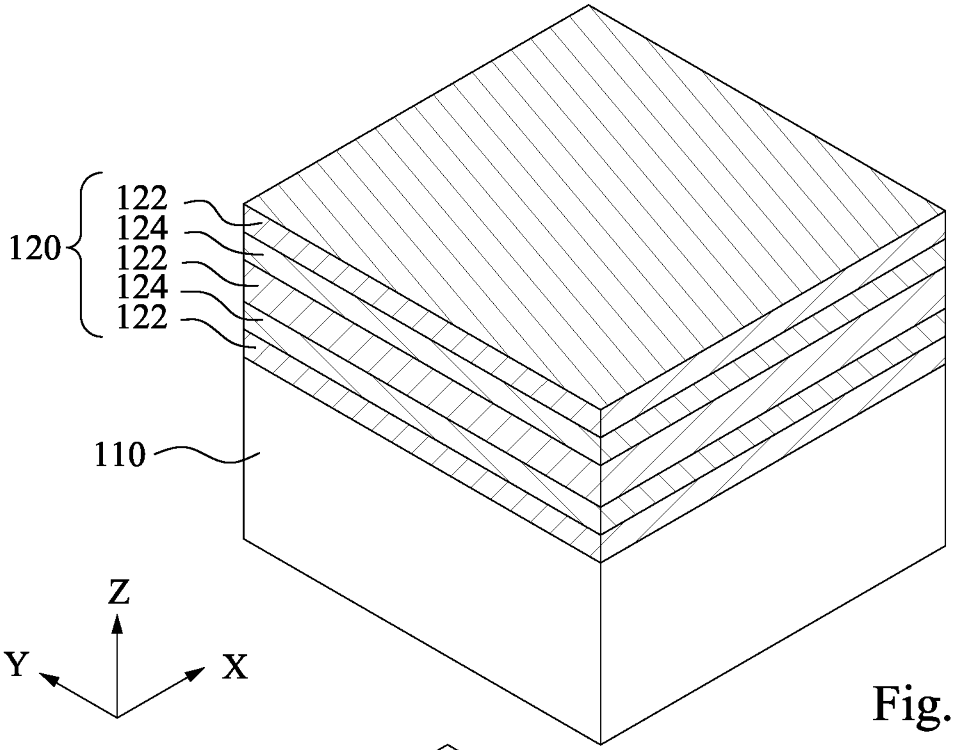
FIGS. 25-34 illustrate perspective views and cross-sectional views of intermediate stages in the formation of an integrated circuit structure (or a semiconductor device) in accordance with some embodiments of the present disclosure.
Figure 26A:
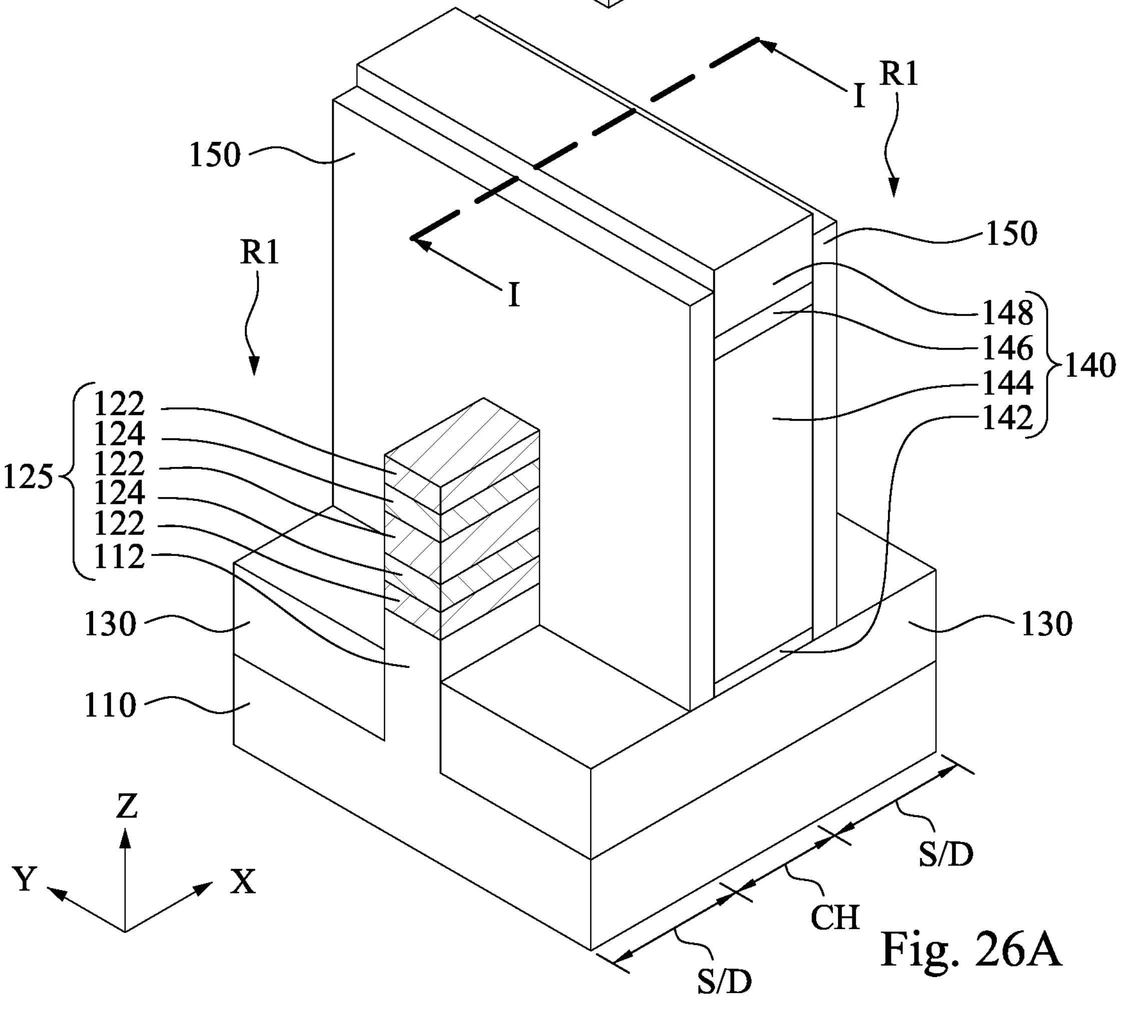
Figure 26B:
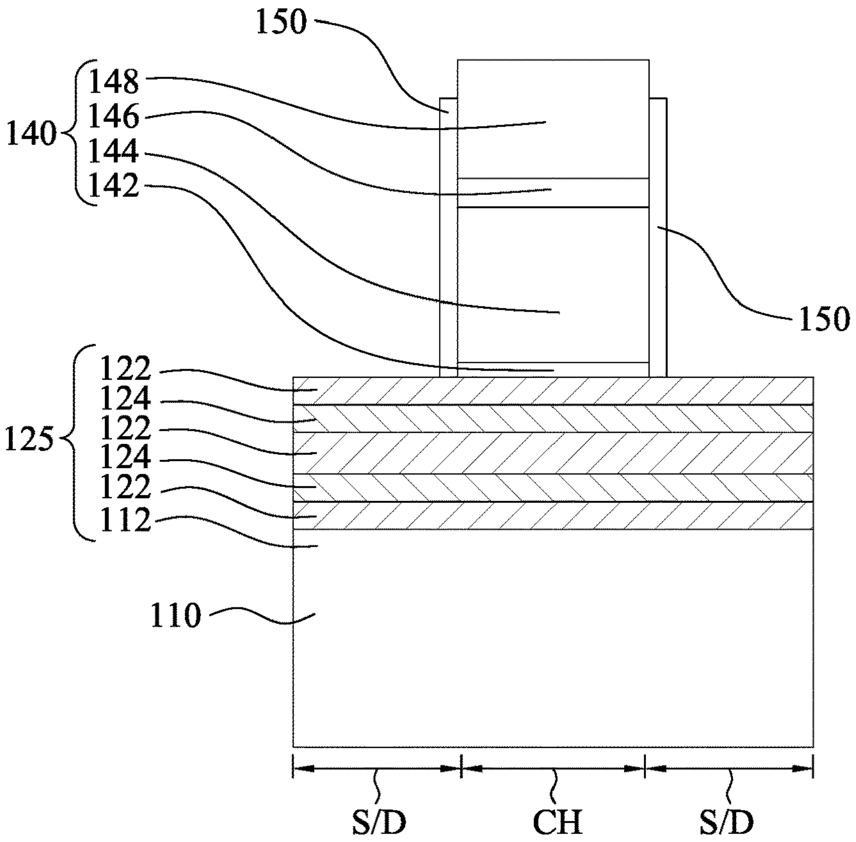
Figure 32:
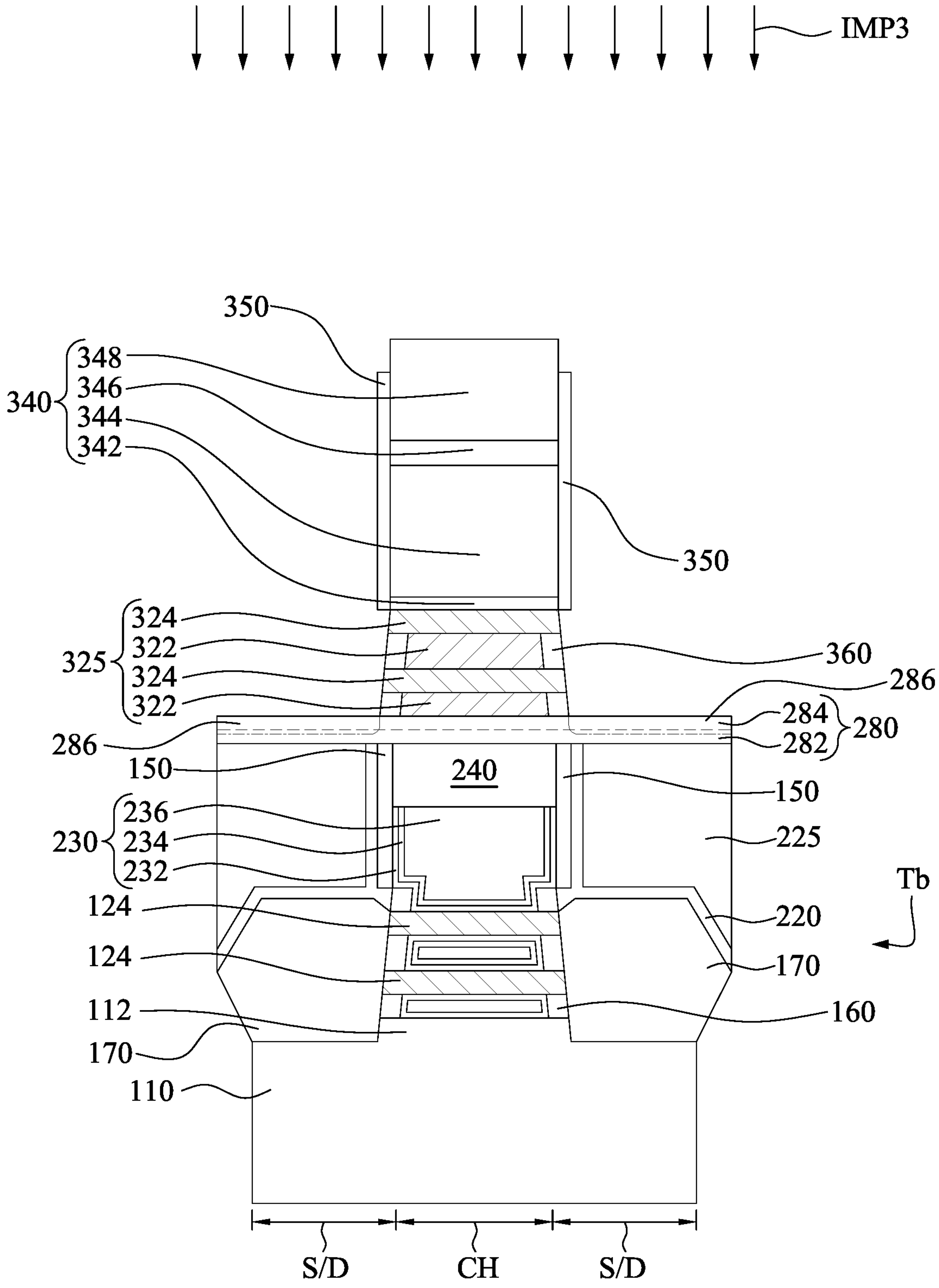
Figure 33:
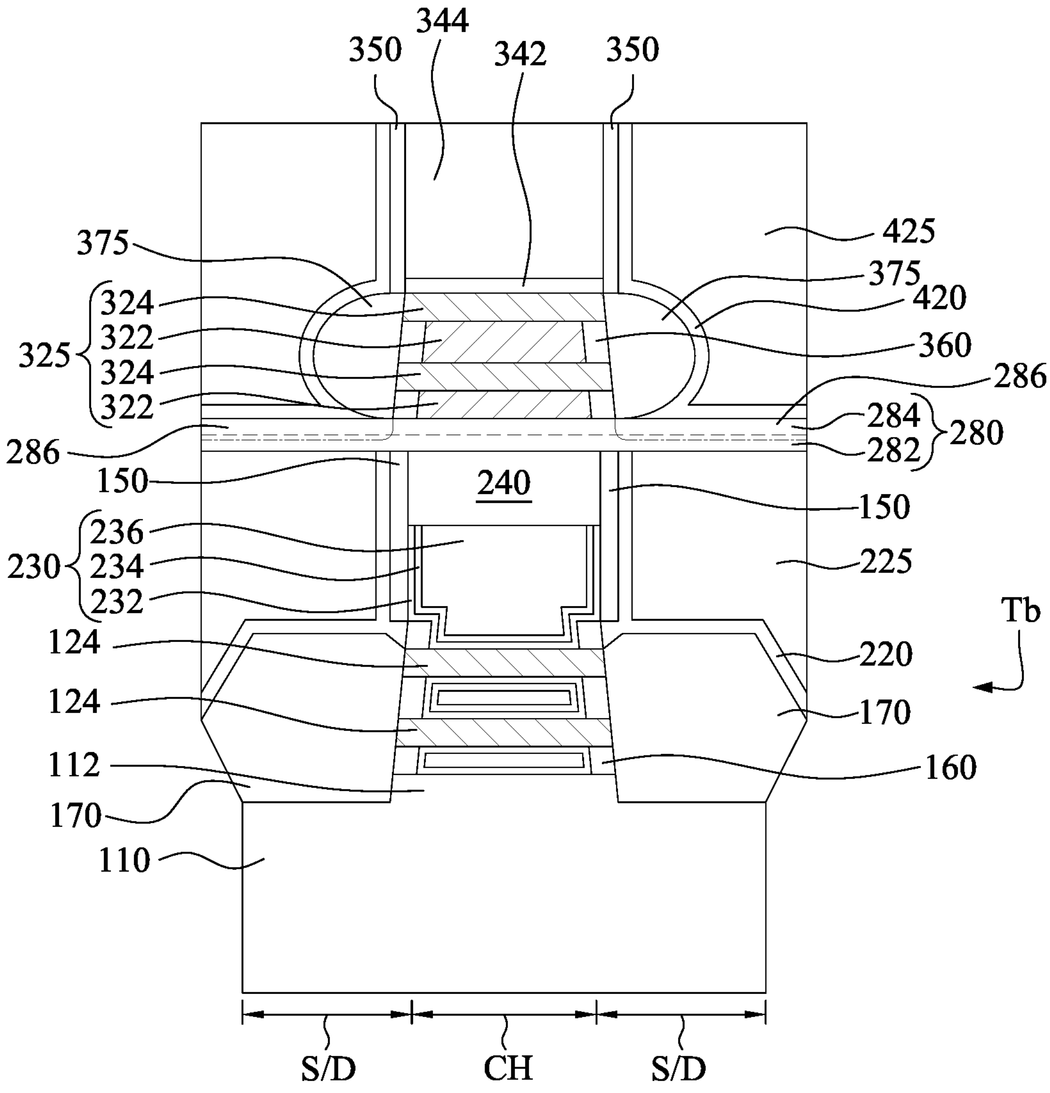
Figure 34:
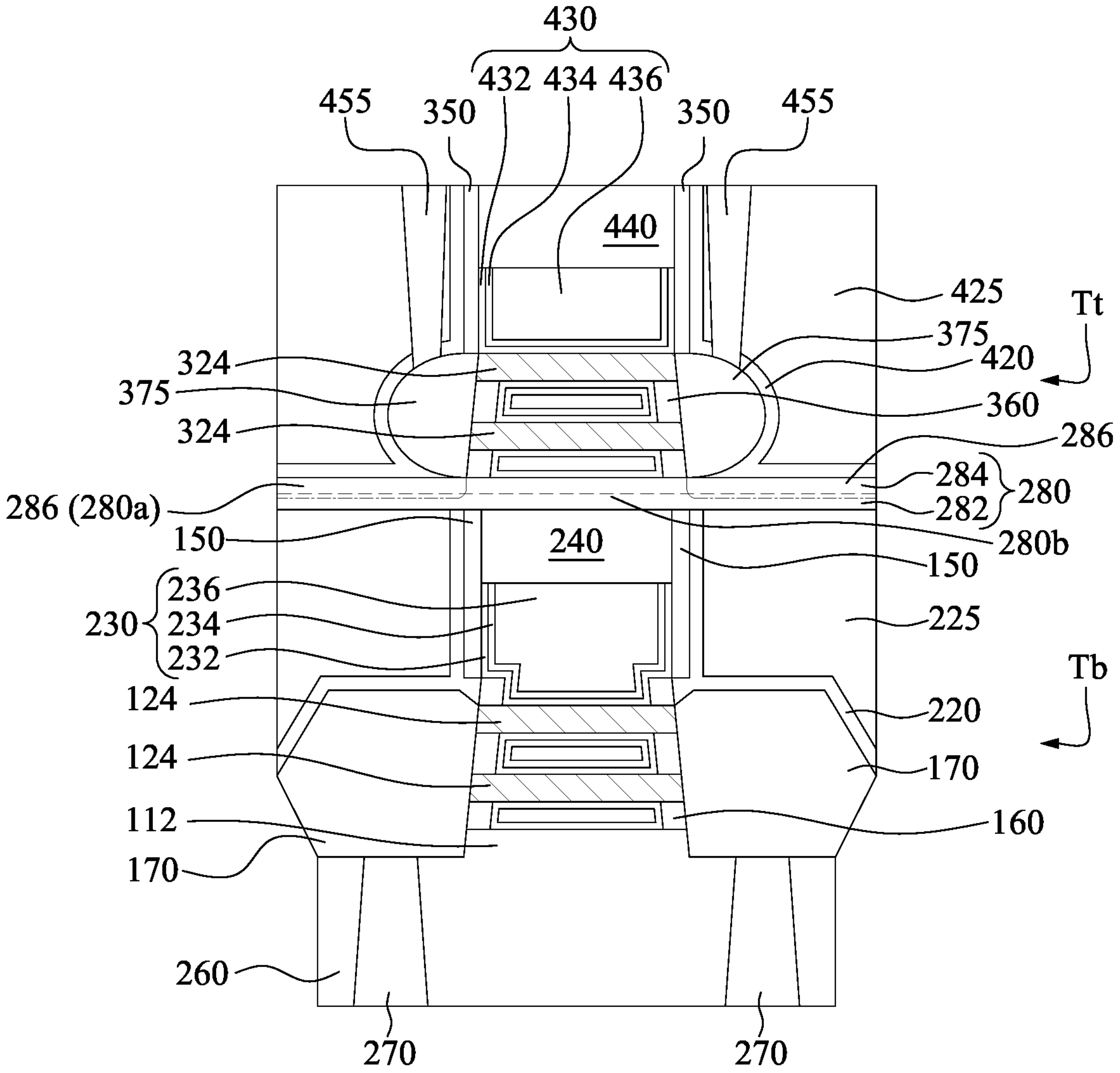

FIGS. 25-34 illustrate perspective views and cross-sectional views of intermediate stages in the formation of an integrated circuit structure (or a semiconductor device) 100*f* in accordance with some embodiments of the present disclosure. In some embodiments, the integrated circuit structure 100*f* in FIG. 34 is a CFET device. In addition to the integrated circuit structure 100*f*, FIGS. 25-26A depict X-axis, Y-axis, and Z-axis directions. FIGS. 26B-34 are cross-sectional views of some embodiments of the integrated circuit structure 100*f* at intermediate stages along a first cut (e.g., cut I-I in FIG. 26A). The formed devices include a p-type transistor (such as a p-type GAA FET) and an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 25-34, and some of the operations described below can be replaced or eliminated, for additional embodiments of the method. The order of the operations/processes may be interchangeable.

Referring to FIG. 25, an epitaxial stack 120 is formed over a substrate 110. The substrate 110 in FIG. 25 is the same as or similar to the substrate 110 in FIG. 1. The epitaxial stack 120 includes epitaxial layers 122 of a first composition interposed by epitaxial layers 124 of a second composition. The epitaxial layers 122 in FIG. 25 are the same as or similar to the epitaxial layers 122*a* in FIG. 1, and the epitaxial layers 124 in FIG. 25 are the same as or similar to the epitaxial layers 124*a* in FIG. 1. The epitaxial layers 124 or portions thereof may form nanostructure channel(s) of the nanostructure transistor (e.g., the bottom transistor Tb in FIG. 28A).

Reference is made to FIGS. 26A and 26B, where FIG. 26B is a cross-sectional view taken along line I-I in FIG. 26A. At least one fin structure 125 extending from the substrate 110 is formed. In various embodiments, the fin structure 125 includes a protruding portion 112 formed from the substrate 110 and portions of each of the epitaxial layers of the epitaxial stack 120 including epitaxial layers 122 and 124. Next, isolation structures 130 are formed to surround the fin structure 125. The isolation structures 130 in FIG. 26A are the same as or similar to the isolation structures 130 in FIG. 2.

At least one dummy gate structure 140 is formed over the substrate 110 and is partially disposed over the fin structure 125. The dummy gate structure 140 in FIGS. 26A and 26B is the same as or similar to the dummy gate structure 140 in FIG. 2. For example, the dummy gate structure 140 includes a gate dielectric layer 142, a dummy gate electrode layer 144, and a hard mask (e.g., a nitride layer 146 and an oxide layer 148). After formation of the dummy gate structure 140 is completed, gate spacers 150 are formed on sidewalls of the dummy gate structure 140. The gate spacers 150 in FIGS. 26A and 26B are the same as or similar to the gate spacers 150 in FIG. 2.

Figure 27:
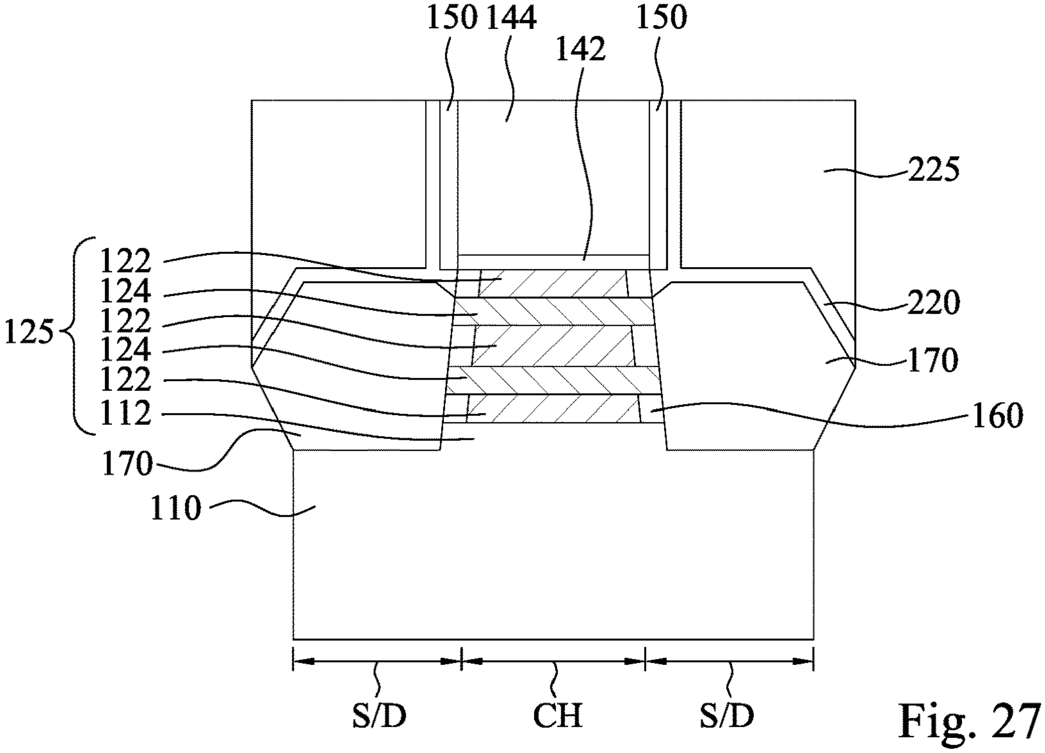

Reference is made to FIG. 27. Exposed portions of the fin structure 125 that extend laterally beyond the gate spacers 150 (e.g., in source/drain regions S/D of the fin structure 125) are etched by using, for example, an anisotropic etching process that uses the dummy gate structure 140 and the gate spacers 150 as an etch mask, resulting in recesses into the fin structure 125. Subsequently, the epitaxial layers 122 are laterally or horizontally recessed, and inner dielectric spacers 160 are filled in the recesses, respectively. The inner dielectric spacers 160 in FIG. 27 are the same as or similar to the inner dielectric spacers 160 in FIG. 4.

First source/drain epitaxial structures 170 are formed over the source/drain regions S/D of the fin structure 125. The first source/drain epitaxial structures 170 in FIG. 27 are the same as or similar to the first source/drain epitaxial structures 170 in FIG. 5. A first interlayer dielectric (ILD) layer 225 is then formed on the substrate 110. In some embodiments, a first contact etch stop layer (CESL) 220 is also formed prior to forming the first ILD layer 225. The first ILD layer 225 in FIG. 27 is the same as or similar to the ILD layer 225 in FIG. 11A, and the first CESL 220 in FIG. 27 is the same as or similar to the CESL 220 in FIG. 11A. After the formation of the first ILD layer 225, the hard mask layers 146 and 148 (as shown in FIGS. 26A and 26B) are removed to expose the dummy gate electrode layer 144.

Figure 28A:
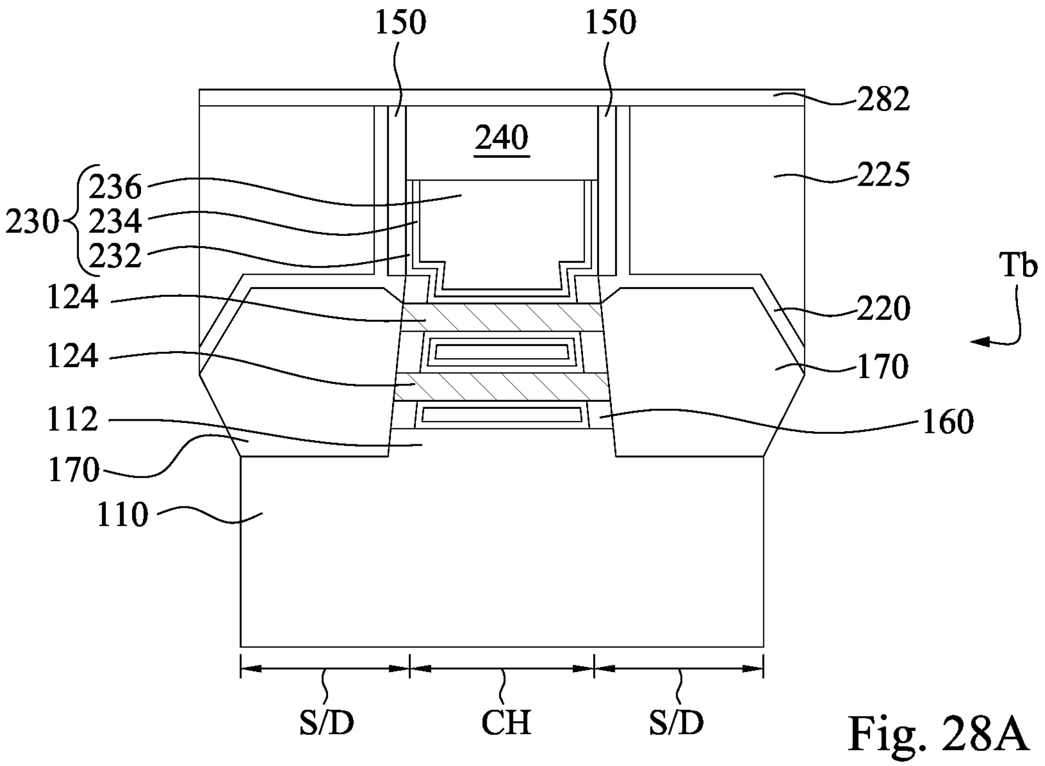

Reference is made to FIG. 28A. Thereafter, the dummy gate electrode layer 144 and the gate dielectric layer 142 in FIG. 27 are removed first, and then the epitaxial layers (i.e., sacrificial layers) 122 in FIG. 27 are removed, thus resulting in a gate trench between the gate spacers 150. Subsequently, a (metal) gate structure 230 is formed in the gate trench to surround each of the epitaxial layers 124 suspended in the gate trench. The gate structure 230 in FIG. 28A is the same as or similar to the gate structure 230 in FIGS. 12A and 12B. For example, the gate structure 230 includes a gate dielectric layer 232, a work function metal layer 234, and a fill metal 236.

After the formation of the gate structure 230, the gate structure 230 may be etched back, and a dielectric cap 240 may be formed over the etched-back gate structure 230. The dielectric cap 240 in FIG. 28A is the same as or similar to the dielectric cap 240 in FIG. 13 or 14. As such, the channel layers 124, the first source/drain epitaxial structures 170, and the gate structure 230 form a bottom transistor Tb.

A first bonding layer 282 is formed over the bottom transistor Tb. In some embodiments, the first bonding layer 282 is a dielectric material including silicon oxide or other suitable materials. The first bonding layer 282 may be formed by atomic layer deposition (ALD), chemical vapor deposition (CVD), and/or other suitable method.

Figure 28B:
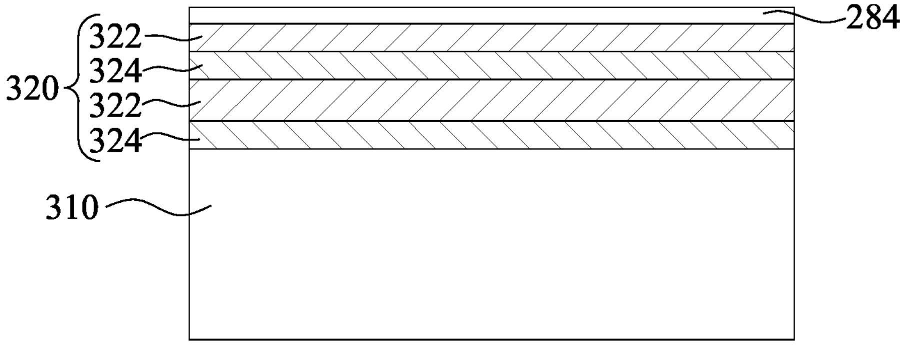

Reference is made to FIG. 28B. Another substrate 310 is provided. In some embodiments, the substrate 310 in FIG. 28B is the same as or similar to the substrate 110 in FIG. 28A. Another epitaxial stack 320 is formed over the substrate 310. The epitaxial stack 320 includes epitaxial layers 322 of the first composition interposed by epitaxial layers 324 of the second composition. In some embodiments, the epitaxial layers 322 in FIG. 28B is the same as or similar to the epitaxial layers 122 in FIG. 25, and the epitaxial layers 324 in FIG. 28B is the same as or similar to the epitaxial layers 124 in FIG. 25. The epitaxial layers 324 or portions thereof may form nanostructure channel(s) of the nanostructure transistor (e.g., the top transistor Tt in FIG. 34). The epitaxial layers 322 may also be referred to as sacrificial layers.

A second bonding layer 284 is formed over the epitaxial stack 320. In some embodiments, the second bonding layer 284 is a dielectric material including silicon oxide or other suitable materials. The second bonding layer 284 may be formed by atomic layer deposition (ALD), chemical vapor deposition (CVD), and/or other suitable method.

Figure 29:
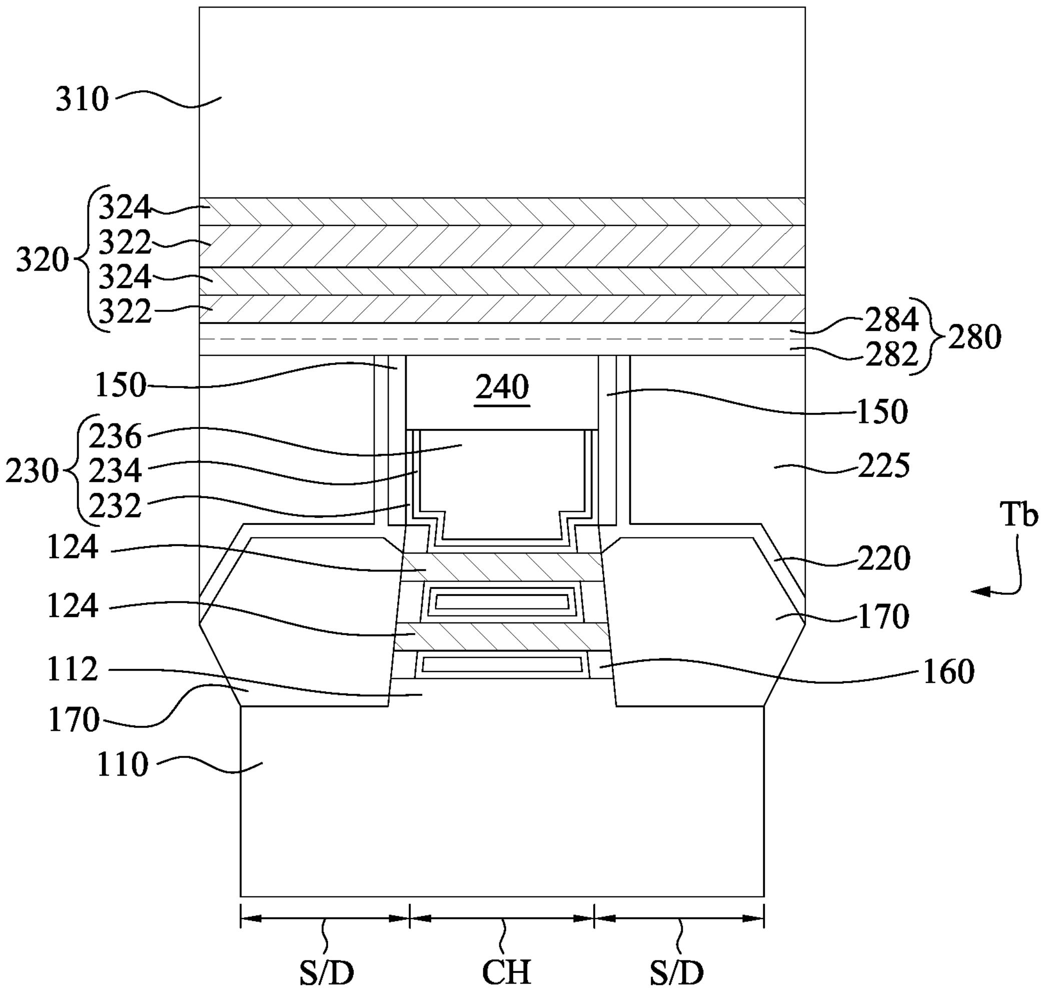

Reference is made to FIG. 29. The structure in FIG. 28B and the structure in FIG. 28A are bonded at the surfaces on which the first and second bonding layers 282 and 284 are formed. The first and second bonding layers 282 and 284 are combined and become an insulator layer 280 bonding the bottom transistor Tb and the epitaxial stack 320. The insulator layer 280 is disposed between and bridges the bottom transistor Tb and the epitaxial stack 320.

Figure 30:
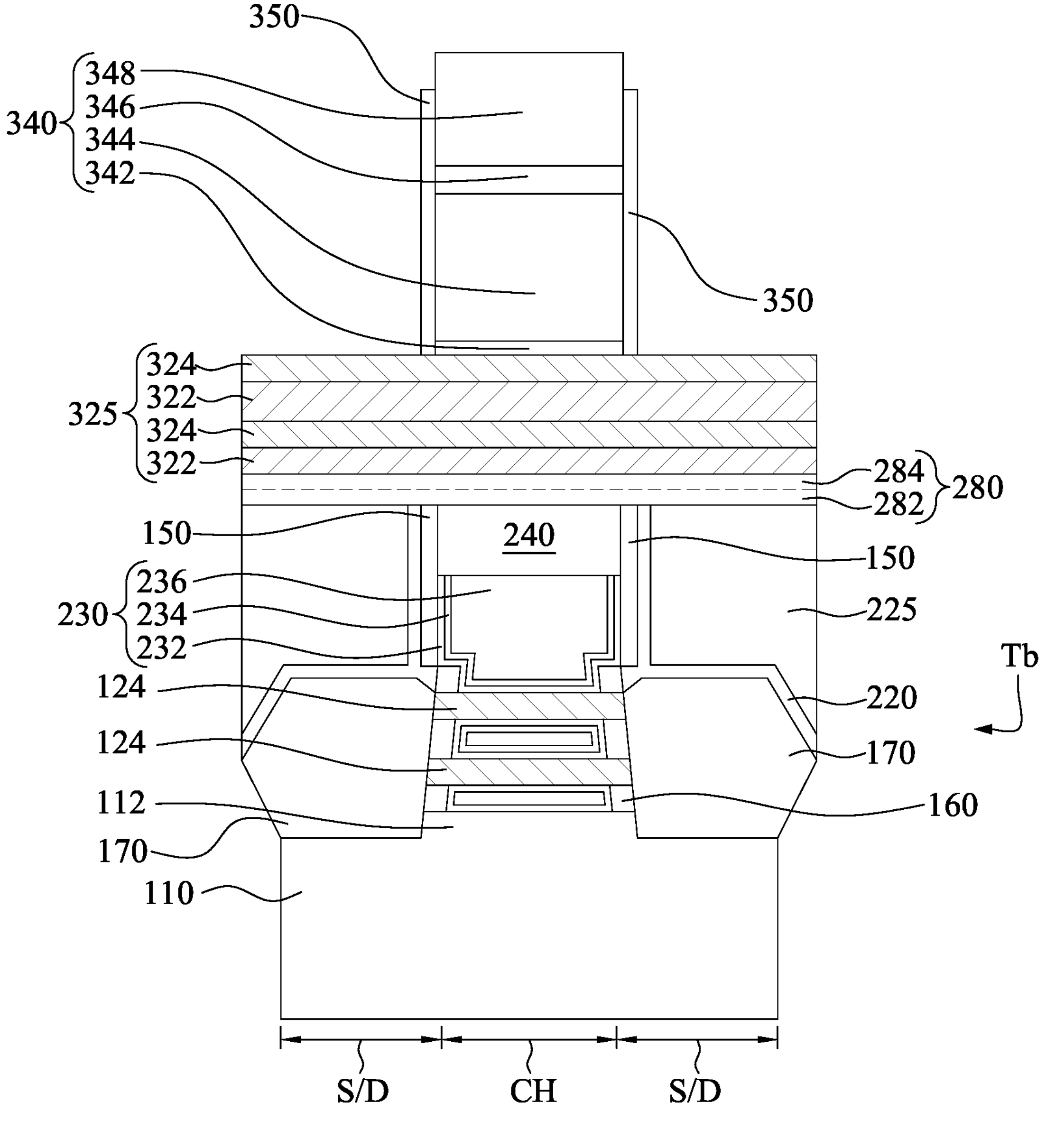

Reference is made to FIG. 30. The substrate 310 in FIG. 29 is removed, such that the top surface of the epitaxial layer 324 is exposed. Subsequently, the epitaxial stack 320 is patterned to form at least one fin structure 325 extending from the insulator layer 280. In various embodiments, the fin structure 325 includes portions of each of the epitaxial layers of the epitaxial stack 320 including epitaxial layers 322 and 324.

At least one dummy gate structure 340 is formed over the insulator layer 280 and is partially disposed over the fin structure 325. The dummy gate structure 340 in FIG. 30 is the same as or similar to the dummy gate structure 140 in FIG. 2. For example, the dummy gate structure 340 includes a gate dielectric layer 342, a dummy gate electrode layer 344, and a hard mask (e.g., a nitride layer 346 and an oxide layer 348). After formation of the dummy gate structure 340 is completed, gate spacers 350 are formed on sidewalls of the dummy gate structure 340. The gate spacers 350 in FIG. 30 are the same as or similar to the gate spacers 150 in FIG. 2. The dummy gate structure 340 may also define source/drain regions S/D of the fin structure 325, for example, the regions of the fin structure 325 adjacent and on opposing sides of the channel region CH.

Figure 31:
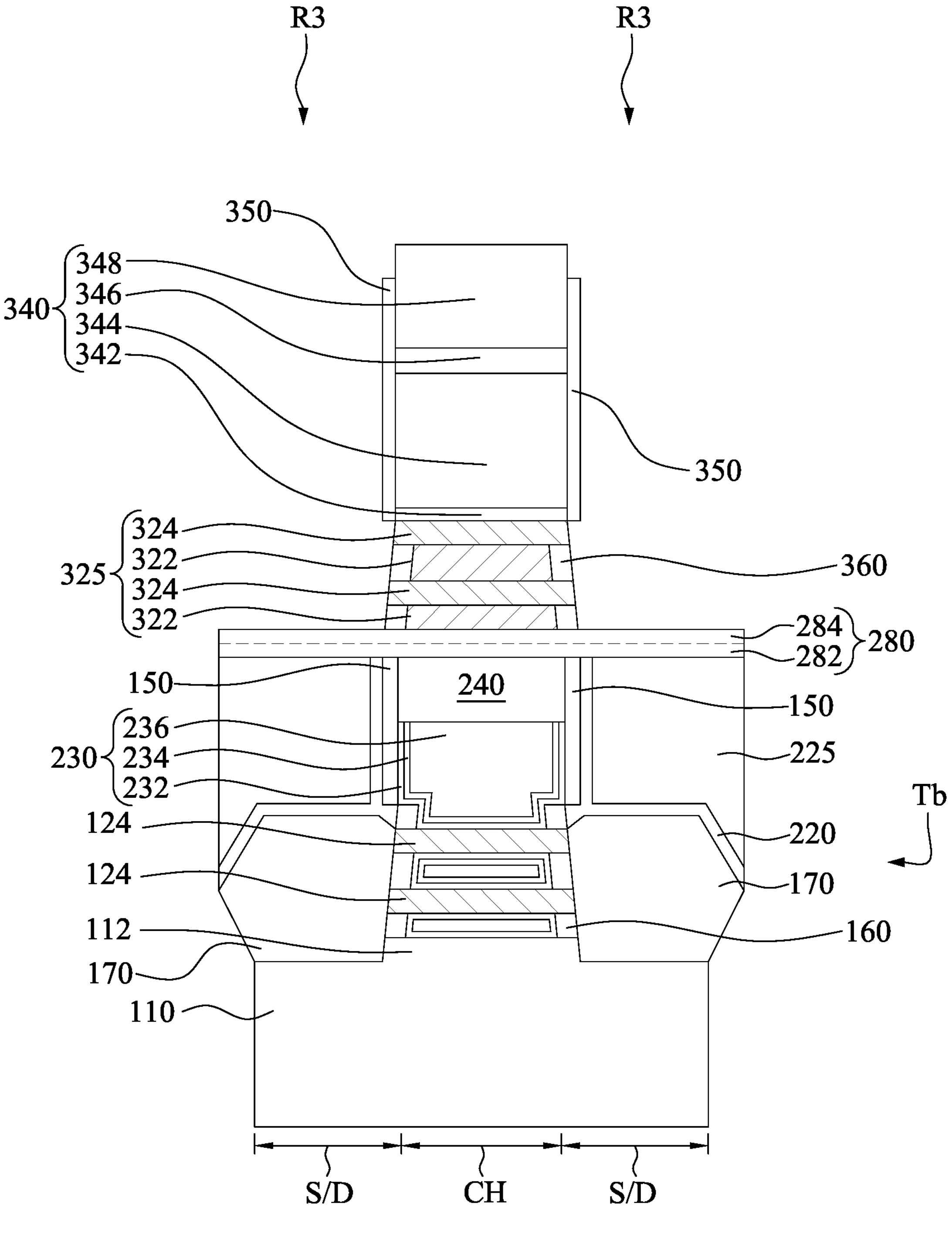

Reference is made to FIG. 31. Exposed portions of the fin structure 325 that extend laterally beyond the gate spacers 350 (e.g., in source/drain regions S/D of the fin structure 325) are etched by using, for example, an anisotropic etching process that uses the dummy gate structure 340 and the gate spacers 350 as an etch mask, resulting in recesses R3 into the fin structure 325. Subsequently, the epitaxial layers 322 are laterally or horizontally recessed, and inner dielectric spacers 360 are filled in the recesses, respectively. The inner dielectric spacers 360 in FIG. 31 are the same as or similar to the inner dielectric spacers 160 in FIG. 4.

Reference is made to FIG. 32. An ion implantation process IMP3 is performed to dope one or more impurities (e.g., dopant ions) into the insulator layer 280. For example, diffusion-blocking dopants (e.g., carbon, fluorine, xenon, silicon, nitrogen, oxygen, sulfur, other suitable species that is able to prevent the dopants in the second source/drain epitaxial structures 375 (see FIG. 33) from diffusing, or combinations thereof) can be implanted into the insulator layer 280, thus forming implanted regions 286 in the insulator layer 280. The fabrication process details about the ion implantation process IMP3 are similar to that about the ion implantation process IMP1, and thus they are not repeated herein for the sake of brevity.

Reference is made to FIG. 33. Second source/drain epitaxial structures 375 are formed over the source/drain regions S/D of the fin structure 325. The second source/drain epitaxial structures 375 in FIG. 33 are the same as or similar to the second source/drain epitaxial structures 175 in FIG. 10. A second ILD layer 425 is then formed on the second source/drain epitaxial structures 375. In some embodiments, a second CESL 420 is also formed prior to forming the second ILD layer 425. The second ILD layer 425 in FIG. 33 is the same as or similar to the ILD layer 225 in FIG. 11A, and the second CESL 420 in FIG. 33 is the same as or similar to the CESL 220 in FIG. 11A. After the formation of the second ILD layer 425, the hard mask layers 346 and 348 (as shown in FIG. 32) are removed to expose the dummy gate electrode layer 344.

Reference is made to FIG. 34. Thereafter, the dummy gate electrode layer 344 and the gate dielectric layer 342 in FIG. 33 are removed first, and then the epitaxial layers (i.e., sacrificial layers) 322 in FIG. 33 are removed, thus resulting in a gate trench between the gate spacers 350. Subsequently, a (metal) gate structure 430 is formed in the gate trench to surround each of the epitaxial layers 324 suspended in the gate trench. The gate structure 430 in FIG. 34 is the same as or similar to the gate structure 230 in FIGS. 12A and 12B. For example, the gate structure 430 includes a gate dielectric layer 432, a work function metal layer 434, and a fill metal 436.

After the formation of the gate structure 430, the gate structure 430 may be etched back, and a dielectric cap 440 may be formed over the etched-back gate structure 430. The dielectric cap 440 in FIG. 34 is the same as or similar to the dielectric cap 240 in FIG. 13 or 14. As such, the channel layers 324, the second source/drain epitaxial structures 375, and the gate structure 430 form a top transistor Tt.

Contacts 455 are then respectively formed in the second ILD layer 425. In some embodiments, prior to the formation of the contacts 455, metal alloy layers are formed on the exposed portions of the second source/drain epitaxial structures 375. Each of the contacts 455 is connected to the second source/drain epitaxial structure 375.

Subsequently, the substrate 110 (as shown in FIG. 33) is removed, such that the backside of the gate structure 230 and the backside of the first source/drain epitaxial structures 170 are exposed. A dielectric isolation layer 260 is then deposited to cover the backside of the gate structure 230 and the backside of the first source/drain epitaxial structures 170. In some embodiments, the dielectric isolation layer 260 is made of materials the same as or similar to that of the ILD layer 225.

Next, backside vias 270 are formed in the dielectric isolation layer 260 to be electrically connected to the first source/drain epitaxial structures 170. In some embodiments, openings are formed in the dielectric isolation layer 260. The opening exposes the first source/drain epitaxial structures 170. The backside vias 270 are then respectively formed in the openings. In some embodiments, prior to the formation of the backside vias 270, metal alloy layers are formed in the openings and on the exposed portions of the first source/drain epitaxial structures 170. Each of the backside vias 270 is connected to the first source/drain epitaxial structure 170. Formation of the backside vias 270 includes depositing one or more conductive (e.g., metal) materials overfilling the openings and then performing a CMP process to remove excessive metal materials outside the openings.

As such, the semiconductor device 100*f* is formed. As shown in FIG. 34, the semiconductor device 100*f* includes the bottom transistor Tb, the top transistor Tt, and the insulator layer 280 between the bottom transistor Tb and the top transistor Tt. The top transistor Tt is over the bottom transistor Tb. The bottom transistor Tb includes the channel layers 124, the first source/drain epitaxial structures 170 on opposite sides of the channel layers 124 and connected to the channel layers 124, and the gate structure 230 wrapping around the channel layers 124. The top transistor Tt includes the channel layers 324, the second source/drain epitaxial structures 375 on opposite sides of the channel layers 324 and connected to the channel layers 324, and the gate structure 430 wrapping around the channel layers 324. The insulator layer 280 is between the top transistor Tt and the bottom transistor Tb. The implanted regions 286 are in the insulator layer 280. Specifically, first portions 280*a* (i.e., the portions where the implanted regions 286 located) of the insulator layer 280 in contact with the second source/drain epitaxial structures 375 each has a dopant concentration higher than a dopant concentration of a second portion 280*b* of the insulator layer 280 directly between the gate structures 230 and 430. In some embodiments, the implanted regions 286 are closer to the second source/drain epitaxial structures 375 than to the first source/drain epitaxial structures 170. In some embodiments, the implanted regions 286 are in contact with the second source/drain epitaxial structures 375 and spaced apart from the first source/drain epitaxial structures 170. Further, the second portion 280*b* of the insulator layer 280 is in contact with the gate structure 430 but may be spaced apart from the gate structure 230.

Figure 35:
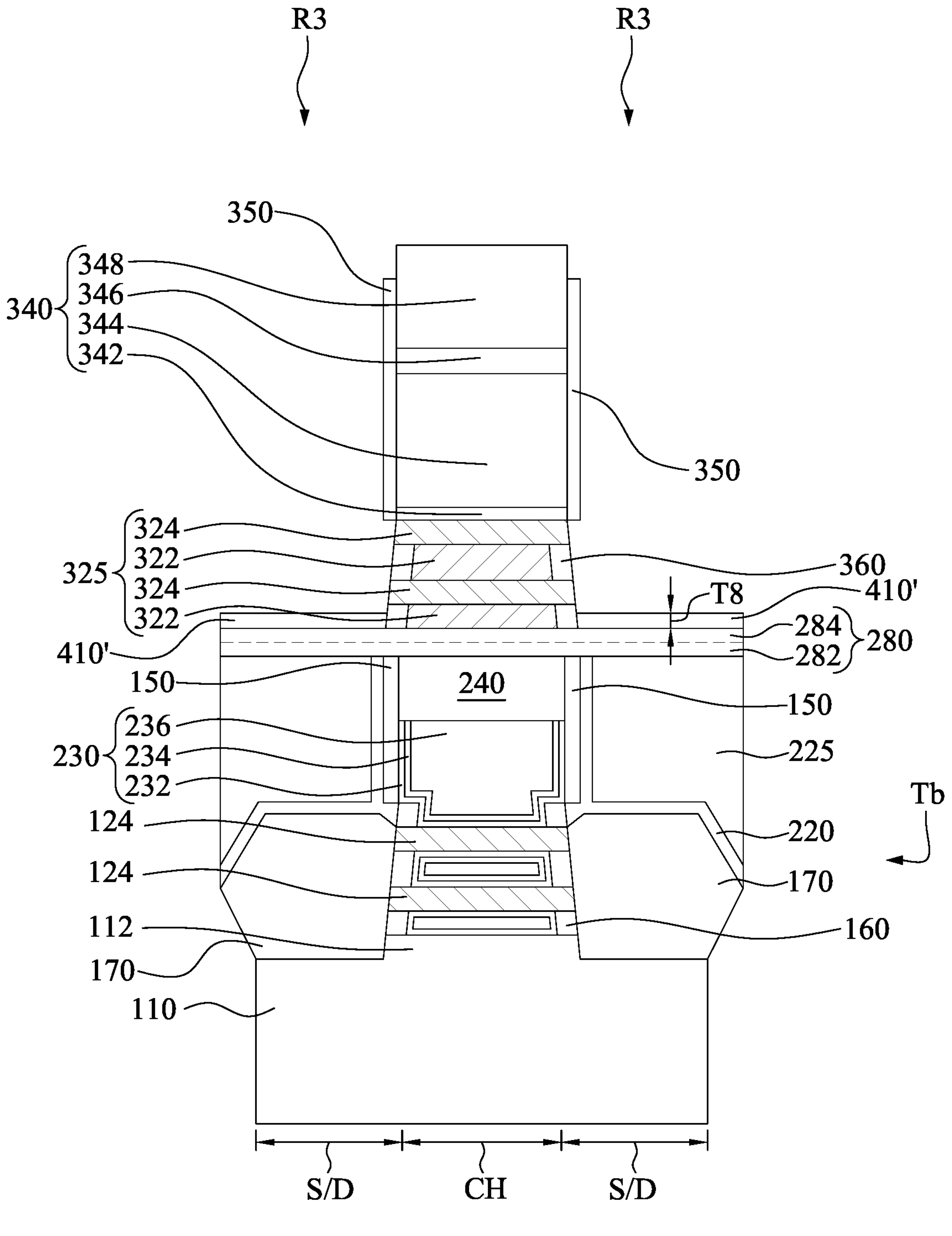
FIGS. 35-37 illustrate cross-sectional views of intermediate stages in the formation of an integrated circuit structure (or a semiconductor device) in accordance with some embodiments of the present disclosure.
Figure 36:
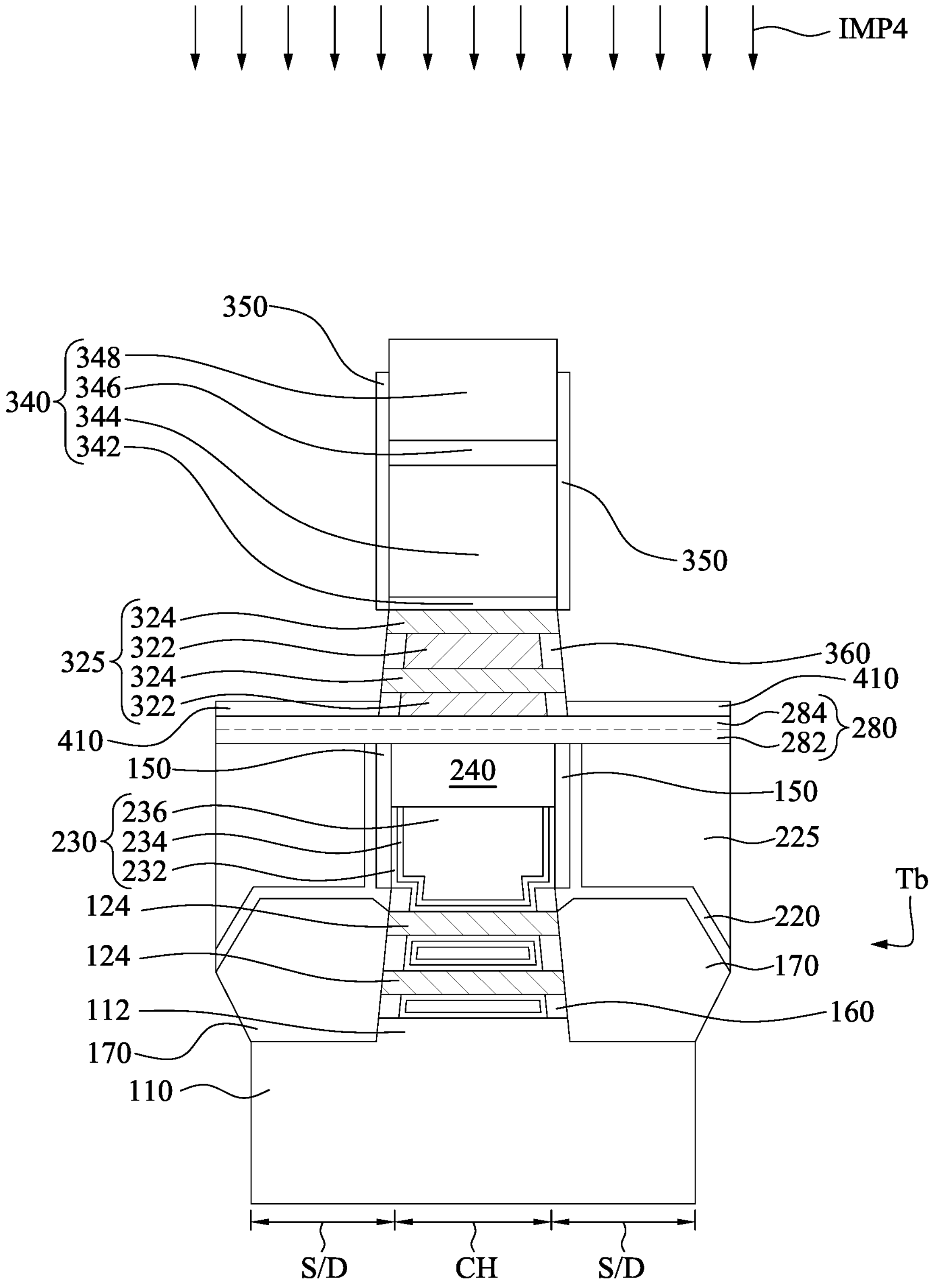
Figure 37:
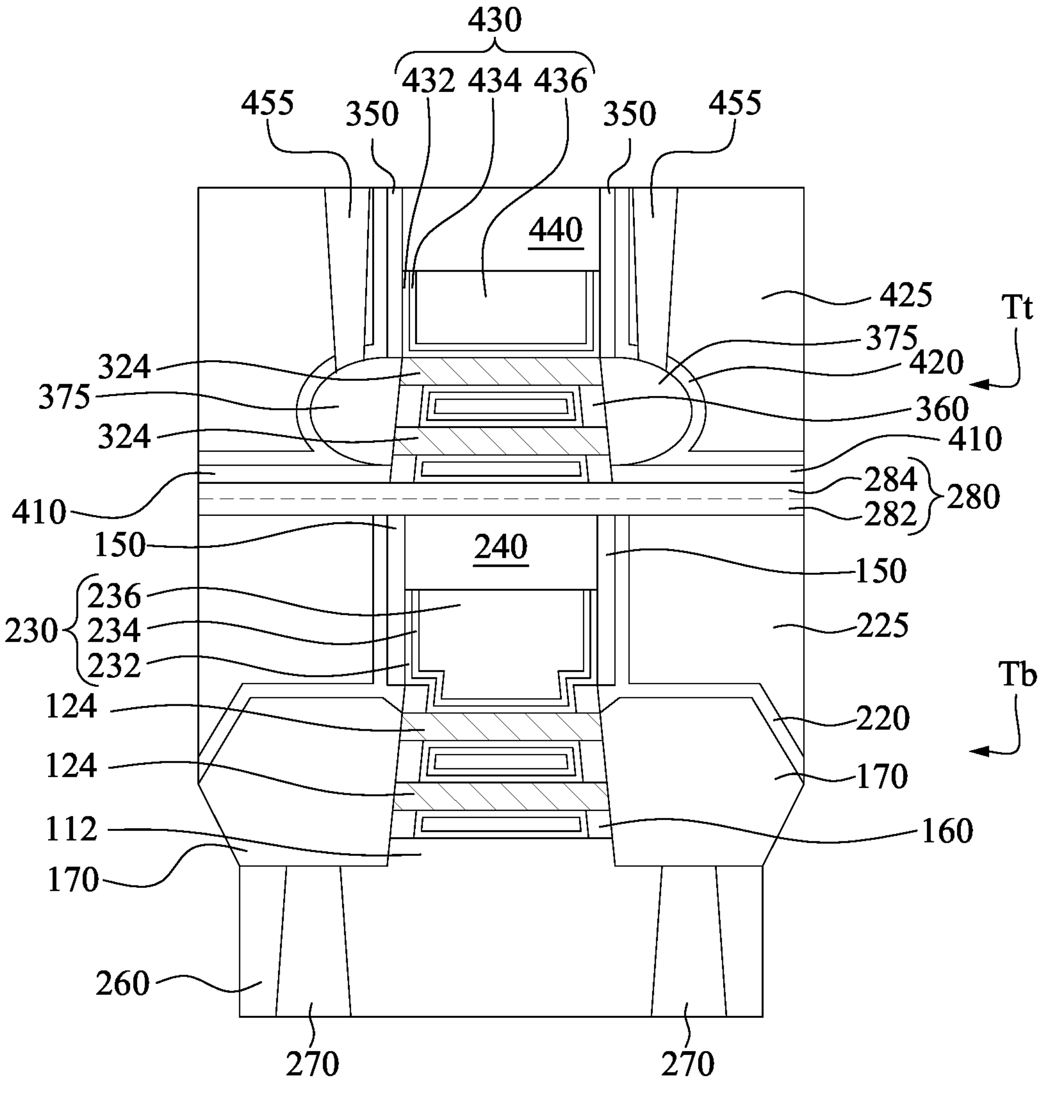

FIGS. 35-37 illustrate cross-sectional views of intermediate stages in the formation of an integrated circuit structure (or a semiconductor device) 100*g* in accordance with some embodiments of the present disclosure. In some embodiments, after the structure as shown in FIG. 31 is formed, dielectric layers 410' are formed to cover the exposed portions of the insulator layer 280, respectively. For example, dielectric materials are formed in the recesses R3 and an etching back process is performed to form the dielectric layers 410'. In some embodiments, the dielectric materials are made of amorphous carbon, $SiO_2$, SiN, SiON, SiCN, SiOCN, $Al_2O_3$, $HfO_2$, SiC, combinations thereof, or the like. The dielectric materials may be formed by ALD, CVD, or other suitable processes. In some embodiments, the dielectric layers 410' have a thickness T8 in a range from about 1 nm to about 50 nm.

Reference is made to FIGS. 35 and 36. An ion implantation process IMP4 is performed to dope one or more impurities (e.g., dopant ions) into the dielectric layers 410'. For example, diffusion-blocking dopants (e.g., carbon, fluorine, xenon, silicon, nitrogen, oxygen, sulfur, other suitable species that is able to prevent the dopants in the second source/drain epitaxial structures 375 (see FIG. 37) from diffusing, or combinations thereof) can be implanted into the dielectric layers 410', thus forming doped dielectric layers 410. The fabrication process details about the ion implantation process IMP4 are similar to that about the ion implantation process IMP1, and thus they are not repeated herein for the sake of brevity.

Reference is made to FIG. 37. After the formation of the doped dielectric layers 410, the structure of FIG. 36 undergoes the processes shown in FIGS. 33-34 to complete the formation of the integrated circuit structure (or a semiconductor device) 100*g* as shown in FIG. 37. As such, the doped dielectric layers 410 are in contact with the second source/drain epitaxial structures 375 as shown in FIG. 37. Other features of the integrated circuit structure 100*g* in FIG. 37 are similar to or the same as those of the integrated circuit structure 100*f* in FIG. 34, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the doped isolation structure and the semiconductive isolation layers are configured to electrically isolate the source/drain epitaxial structures of the top transistor and the bottom transistor. In addition, the diffusion-blocking dopants in the doped isolation structure and the semiconductive isolation layers also prevent the N-type and P-type dopants in the source/drain epitaxial structures from inter-diffusing. Also, with the existence of the doped isolation structure and the semiconductive isolation layers, the aspect ratio of recesses in the source/drain region of the fin structure is reduced.

According to some embodiments, a method includes forming a fin structure over a substrate, wherein the fin structure includes a first channel layer, a sacrificial layer over the first channel layer, and a second channel layer over the sacrificial layer; forming a dummy gate structure across the fin structure; recessing the fin structure by using the dummy gate structure as an etch mask; after recessing the fin structure, epitaxially growing first source/drain epitaxial structures on opposite sides of the first channel layer; forming first dielectric layers over the substrate and covering the first source/drain epitaxial structures, respectively; epitaxially growing second source/drain epitaxial structures on opposite sides of the second channel layer, wherein the second source/drain epitaxial structures are over the first doped dielectric layers, respectively; removing the dummy gate structure and the sacrificial layer to form a gate trench between the first source/drain epitaxial structures and between the second source/drain epitaxial structures; and forming a metal gate structure in the gate trench. The second source/drain epitaxial structures are over the first dielectric layers, respectively.

According to some embodiments, a method includes forming a fin structure over a substrate, wherein the fin structure includes a bottom channel layer, a sacrificial layer, and a top channel layer arranged in a vertical direction; forming a dummy gate structure over the fin structure; removing portions of the fin structure not covered by the dummy gate structure; forming first source/drain epitaxial structures on the substrate and connected to the bottom channel layer, wherein the first source/drain epitaxial structures include SiGe; forming semiconductive isolation layers over the first source/drain epitaxial structures, respectively, wherein a germanium concentration of the semiconductive isolation layers is lower than a germanium concentration of the first source/drain epitaxial structures, the semiconductive isolation layers include diffusion-blocking dopants; forming second source/drain epitaxial structures over the semiconductive isolation layers and connected to the top channel layer; and replacing the dummy gate structure and the sacrificial layer with a metal gate structure.

According to some embodiments, a device includes a bottom transistor, a top transistor, and an insulator layer. The bottom transistor includes a first channel layer; first source/drain epitaxial structures on opposite sides of the first channel layer; a first gate structure around the first channel layer. The top transistor is over the bottom transistor and includes a second channel layer; second source/drain epitaxial structures on opposite sides of the second channel layer; and a second gate structure around the second channel layer. The insulator layer is between the bottom transistor and the top transistor. A first portion of the insulator layer in contact with one of the second source/drain epitaxial structures has a dopant concentration higher than a dopant concentration of a second portion of the insulator layer directly between the first gate structure and the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a fin structure over a substrate, wherein the fin structure comprises a first channel layer, a sacrificial layer over the first channel layer, and a second channel layer over the sacrificial layer;

forming a dummy gate structure across the fin structure;

recessing the fin structure by using the dummy gate structure as an etch mask;

after recessing the fin structure, epitaxially growing first source/drain epitaxial structures on opposite sides of the first channel layer;

forming first dielectric layers over the substrate and covering the first source/drain epitaxial structures, respectively;

performing a first implantation process to the first dielectric layers to form first doped dielectric layers over the first source/drain epitaxial structures, respectively;

forming second dielectric layers over the substrate and covering the first doped dielectric layers, respectively;

after forming the second dielectric layers, epitaxially growing second source/drain epitaxial structures on opposite sides of the second channel layer, wherein the second source/drain epitaxial structures are over the first dielectric layers, respectively;

removing the dummy gate structure and the sacrificial layer to form a gate trench between the first source/drain epitaxial structures and between the second source/drain epitaxial structures; and forming a metal gate structure in the gate trench.

2. The method of claim 1, wherein the first dielectric layers are in contact with the first source/drain epitaxial structures.

3. The method of claim 1, further comprising:

performing a second implantation process to the second dielectric layers to form second doped dielectric layers over the first doped dielectric layers, respectively.

4. The method of claim 1, wherein a thickness of each of the second dielectric layers is greater than a thickness of each of the first dielectric layers.

5. A method comprising:

forming a fin structure over a substrate, wherein the fin structure comprises a bottom channel layer, a sacrificial layer, and a top channel layer arranged in a vertical direction;

forming a dummy gate structure over the fin structure;

removing portions of the fin structure not covered by the dummy gate structure;

forming first source/drain epitaxial structures on the substrate and connected to the bottom channel layer, wherein the first source/drain epitaxial structures comprise SiGe;

forming semiconductive isolation layers over the first source/drain epitaxial structures, respectively, wherein a germanium concentration of the semiconductive isolation layers is lower than a germanium concentration of the first source/drain epitaxial structures, and the semiconductive isolation layers comprise diffusion-blocking dopants, and each of the semiconductive isolation layers comprises:

a first epitaxial layer in contact with one of the first source/drain epitaxial structures; and a second epitaxial layer in contact with the first epitaxial layer, wherein the diffusion-blocking dopants are in at least one of the first epitaxial layer and the second epitaxial layer, forming second source/drain epitaxial structures over the semiconductive isolation layers and connected to the top channel layer, wherein the second epitaxial layer of each of the semiconductive isolation layers is in contact with one of the second source/drain epitaxial structures; and replacing the dummy gate structure and the sacrificial layer with a metal gate structure.

6. The method of claim 5, wherein the semiconductive isolation layers are in contact with the second source/drain epitaxial structures.

7. The method of claim 5, wherein the diffusion-blocking dopants comprise carbon, fluorine, xenon, silicon, nitrogen, oxygen, sulfur, or combinations thereof.

8. The method of claim 5, wherein a concentration of the diffusion-blocking dopants in a middle of one of the semiconductive isolation layers is lower than a concentration of the diffusion-blocking dopants in a bottom of said one of the semiconductive isolation layers.

9. A method comprising:

forming a first transistor over a substrate, wherein the first transistor comprises:

a first gate structure over the substrate;

a first channel layer embedded in the first gate structure;

first source/drain epitaxial structures on opposite sides of the first gate structure and connected to the first channel layer;

depositing a first bonding layer over the first transistor and the substrate;

bonding the first bonding layer with a second bonding layer to form a semiconductor stack over the first transistor through the first bonding layer and the second bonding layer;

after bonding the first bonding layer with the second bonding layer, patterning the semiconductor stack to form a fin structure over the second bonding layer;

forming a dummy gate structure across the fin structure;

recessing the fin structure by using the dummy gate structure as an etch mask to form recesses in the fin structure, wherein the recesses expose the second bonding layer;

after recessing the fin structure, performing an implantation process with dopants to the recesses, wherein the dopants comprise carbon, fluorine, xenon, silicon, nitrogen, oxygen, sulfur, or combinations thereof, and after performing the implantation process with the dopants, the dopants are doped in the second bonding layer;

after performing the implantation process, depositing second source/drain epitaxial structures in the recesses, respectively; and replacing the dummy gate structure with a second gate structure to form a second transistor over the first transistor.

10. The method of claim 9, wherein the first bonding layer is undoped after performing the implantation process with the dopants.

11. The method of claim 1, wherein the second dielectric layers are in contact with the second source/drain epitaxial structures.

12. The method of claim 1, wherein a bottom surface of one of the first doped dielectric layers is lower than a top surface of the one of the first source/drain epitaxial structures.

13. The method of claim 3, wherein dopants in the second doped dielectric layers are different from dopants in the first doped dielectric layers.

14. The method of claim 5, wherein the diffusion-blocking dopants are in the first epitaxial layer.

15. The method of claim 5, wherein the diffusion-blocking dopants are in the first epitaxial layer and the second epitaxial layer.

16. The method of claim 5, wherein a thickness of the second epitaxial layer is greater than a thickness of the first epitaxial layer.

17. The method of claim 5, wherein the semiconductive isolation layers are undoped with N-type dopants and P-type dopants.

18. The method of claim 9, further comprising depositing a contact etch stop layer to cover the second source/drain epitaxial structures prior to replacing the dummy gate structure with the second gate structure.

19. The method of claim 18, wherein the contact etch stop layer is in contact with the second bonding layer.

20. The method of claim 9, wherein the second bonding layer comprises a first portion under the fin structure and a second portion under one of the second source/drain epitaxial structures, and the a concentration of the dopants in the first portion of the second bonding layer is lower than a concentration of the dopants in the second portion of the second bonding layer.

* * * * *